(12) United States Patent
Minervini

(10) Patent No.: US 9,980,038 B2
(45) Date of Patent: *May 22, 2018

(54) TOP PORT MULTI-PART SURFACE MOUNT SILICON CONDENSER MICROPHONE

(71) Applicant: Knowles Electronics, LLC, Itasca, IL (US)

(72) Inventor: Anthony D. Minervini, Palos Hills, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/606,686

(22) Filed: May 26, 2017

(65) Prior Publication Data

US 2017/0264997 A1  Sep. 14, 2017

Related U.S. Application Data

(60) Continuation of application No. 15/135,125, filed on Apr. 21, 2016, now Pat. No. 9,693,133, which is a
(Continued)

(51) Int. Cl.
*H04R 1/28* (2006.01)
*B81B 7/00* (2006.01)
(Continued)

(52) U.S. Cl.
CPC ......... *H04R 1/2892* (2013.01); *B81B 3/0021* (2013.01); *B81B 7/007* (2013.01);
(Continued)

(58) Field of Classification Search
CPC ..... H01L 23/10; H01L 23/043; B81B 7/0061; B81B 7/0064; B81B 3/0021; H04R 19/04; H04R 19/005
See application file for complete search history.

(56) References Cited

U.S. PATENT DOCUMENTS 3,192,086 A   6/1965  Gyurk
3,567,844 A   3/1971  Krcmar
(Continued)

OTHER PUBLICATIONS

Khadpe, S., "Worldwide Activities in Flip Chip, BGA and TAB Technologies and Markets", pp. 290-293, Proceedings 1995 International Flip Chip, Ball Grid Array, TAB and Advanced Packaging Symposium (1995).
(Continued)

*Primary Examiner* — Alonzo Chambliss
(74) *Attorney, Agent, or Firm* — Foley & Lardner LLP

(57) ABSTRACT

A surface mount package for a micro-electro-mechanical system (MEMS) microphone die is disclosed. The surface mount package features a substrate with metal pads for surface mounting the package to a device's printed circuit board and for making electrical connections between the microphone package and the device's circuit board. The surface mount microphone package has a cover, and the MEMS microphone die is substrate-mounted and acoustically coupled to an acoustic port provided in the surface mount package. The substrate and the cover are joined together to form the MEMS microphone, and the substrate and cover cooperate to form an acoustic chamber for the substrate-mounted MEMS microphone die.

20 Claims, 19 Drawing Sheets

Related U.S. Application Data continuation of application No. 14/836,499, filed on Aug. 26, 2015, now Pat. No. 9,338,560, which is a continuation of application No. 14/258,870, filed on Apr. 22, 2014, now Pat. No. 9,148,731, which is a continuation of application No. 13/732,179, filed on Dec. 31, 2012, now Pat. No. 8,704,360, which is a continuation of application No. 13/286,558, filed on Nov. 1, 2011, now Pat. No. 8,358,004, which is a continuation of application No. 13/111,537, filed on May 19, 2011, now Pat. No. 8,121,331, which is a continuation of application No. 11/741,881, filed on Apr. 30, 2007, now Pat. No. 8,018,049, which is a division of application No. 10/921,747, filed on Aug. 19, 2004, now Pat. No. 7,434,305, which is a continuation-in-part of application No. 09/886,854, filed on Jun. 21, 2001, now Pat. No. 7,166,910.

(60) Provisional application No. 60/253,543, filed on Nov. 28, 2000.

(51) Int. Cl.
  *H04R 19/00* (2006.01)
  *H04R 19/01* (2006.01)
  *H04R 19/04* (2006.01)
  *H04R 31/00* (2006.01)
  *B81C 1/00* (2006.01)
  *H01L 23/10* (2006.01)
  *H01L 23/15* (2006.01)
  *H04R 1/04* (2006.01)
  *H04R 3/00* (2006.01)
  *B81C 3/00* (2006.01)
  *B81B 3/00* (2006.01)
  *H01L 21/78* (2006.01)
  *H04R 1/22* (2006.01)
  *H04R 23/00* (2006.01)

(52) U.S. Cl.
  CPC .......... *B81B 7/0038* (2013.01); *B81B 7/0058* (2013.01); *B81B 7/0061* (2013.01); *B81B 7/0064* (2013.01); *B81C 1/00158* (2013.01); *B81C 1/00301* (2013.01); *B81C 3/00* (2013.01); *H01L 21/78* (2013.01); *H01L 23/10* (2013.01); *H01L 23/15* (2013.01); *H04R 1/04* (2013.01); *H04R 1/222* (2013.01); *H04R 3/00* (2013.01); *H04R 19/005* (2013.01); *H04R 19/016* (2013.01); *H04R 19/04* (2013.01); *H04R 23/00* (2013.01); *H04R 31/006* (2013.01); *B81B 2201/0257* (2013.01); *B81B 2207/092* (2013.01); *H01L 2924/0002* (2013.01); *H01L 2924/1461* (2013.01); *H04R 2201/003* (2013.01); *H04R 2225/49* (2013.01); *H04R 2410/03* (2013.01); *Y10T 29/49005* (2015.01); *Y10T 29/4908* (2015.01); *Y10T 29/49798* (2015.01)

(56) References Cited

U.S. PATENT DOCUMENTS

| | | |
|---|---|---|
| 3,735,209 A | 5/1973 | Saddler |
| 3,735,211 A | 5/1973 | Kapnias |
| 4,127,840 A | 11/1978 | House |
| 4,222,277 A | 9/1980 | Kurtz et al. |
| 4,277,814 A | 7/1981 | Giachino et al. |
| 4,314,226 A | 2/1982 | Oguro et al. |
| 4,456,796 A | 6/1984 | Nakagawa et al. |
| 4,533,795 A | 8/1985 | Baumhauer et al. |
| 4,558,184 A | 12/1985 | Busch-Vishniac et al. |
| 4,628,740 A | 12/1986 | Ueda et al. |
| 4,643,935 A | 2/1987 | McNeal et al. |
| 4,691,363 A | 9/1987 | Khanna |
| 4,737,742 A | 4/1988 | Takoshima et al. |
| 4,776,019 A | 10/1988 | Miyatake |
| 4,825,335 A | 4/1989 | Wilner |
| 4,891,686 A | 1/1990 | Krausse, III |
| 4,908,805 A | 3/1990 | Sprenkels |
| 4,910,840 A | 3/1990 | Sprenkels |
| 4,984,268 A | 1/1991 | Brown |
| 5,099,396 A | 3/1992 | Barz et al. |
| 5,101,543 A | 4/1992 | Cote et al. |
| 5,101,665 A | 4/1992 | Mizuno |
| 5,146,435 A | 9/1992 | Bernstein |
| 5,151,763 A | 9/1992 | Jiri et al. |
| 5,153,379 A | 10/1992 | Guzuk et al. |
| 5,159,537 A | 10/1992 | Okano |
| 5,178,015 A | 1/1993 | Loeppert et al. |
| 5,202,652 A | 4/1993 | Toyoji et al. |
| 5,216,278 A | 6/1993 | Lin et al. |
| 5,237,235 A | 8/1993 | Cho et al. |
| 5,241,133 A | 8/1993 | Mullen, III et al. |
| 5,252,882 A | 10/1993 | Yatsuda |
| 5,257,547 A | 11/1993 | Boyer |
| 5,313,371 A | 5/1994 | Knecht et al. |
| 5,357,807 A | 10/1994 | Guckel et al. |
| 5,394,011 A | 2/1995 | Hiroyasu et al. |
| 5,400,949 A | 3/1995 | Timo et al. |
| 5,408,731 A | 4/1995 | Berggvist et al. |
| 5,449,909 A | 9/1995 | Kaiser et al. |
| 5,452,268 A | 9/1995 | Bernstein |
| 5,459,368 A | 10/1995 | Keiji et al. |
| 5,477,008 A | 12/1995 | Pasqualoni et al. |
| 5,490,220 A | 2/1996 | Loeppert |
| 5,506,919 A | 4/1996 | Roberts |
| 5,531,787 A | 7/1996 | Lesinski et al. |
| 5,545,912 A | 8/1996 | Ljubisa et al. |
| 5,592,391 A | 1/1997 | Muyshondt et al. |
| 5,593,926 A | 1/1997 | Mitsuaki et al. |
| 5,611,129 A | 3/1997 | Hisaya et al. |
| 5,659,195 A | 8/1997 | Kaiser et al. |
| 5,712,523 A | 1/1998 | Nakashima et al. |
| 5,736,783 A | 4/1998 | Wein et al. |
| 5,740,261 A | 4/1998 | Loeppert et al. |
| 5,748,758 A | 5/1998 | Menasco et al. |
| 5,761,053 A | 6/1998 | King et al. |
| 5,776,798 A | 7/1998 | Quan et al. |
| 5,783,748 A | 7/1998 | Otani |
| 5,789,679 A | 8/1998 | Koshimizu et al. |
| 5,818,145 A | 10/1998 | Fukiharu |
| 5,831,262 A | 11/1998 | Greywall et al. |
| 5,838,551 A | 11/1998 | Chan |
| 5,852,320 A | 12/1998 | Ichihashi |
| 5,870,482 A | 2/1999 | Loeppert et al. |
| 5,886,876 A | 3/1999 | Yamaguchi |
| 5,889,872 A | 3/1999 | Sooriakumar et al. |
| 5,895,229 A | 4/1999 | Carney et al. |
| 5,898,574 A | 4/1999 | Wiling et al. |
| 5,901,046 A | 5/1999 | Tameharu et al. |
| 5,923,995 A | 7/1999 | Kao et al. |
| 5,939,784 A | 8/1999 | Glenn et al. |
| 5,939,968 A | 8/1999 | Nguyen et al. |
| 5,949,305 A | 9/1999 | Shimamura |
| 5,976,912 A | 11/1999 | Naoki et al. |
| 5,977,626 A | 11/1999 | Wang et al. |
| 5,981,314 A | 11/1999 | Glenn et al. |
| 5,999,821 A | 12/1999 | Kaschke |
| 6,003,381 A | 12/1999 | Kato |
| 6,012,335 A | 1/2000 | Rashid et al. |
| 6,052,464 A | 4/2000 | Harris |
| 6,066,882 A | 5/2000 | Kato |
| 6,078,245 A | 6/2000 | Fritz et al. |
| 6,088,463 A | 7/2000 | Rombach |
| 6,093,972 A | 7/2000 | Carney et al. |
| 6,108,184 A | 8/2000 | Minervini |
| 6,117,705 A | 9/2000 | Glenn et al. |
| 6,118,881 A | 9/2000 | Quinlan |
| 6,119,920 A | 9/2000 | Guthrie et al. |

(56) References Cited

U.S. PATENT DOCUMENTS

| | | |
|---|---|---|
| 6,136,419 A | 10/2000 | Fasano et al. |
| 6,140,144 A | 10/2000 | Nader et al. |
| 6,147,876 A | 11/2000 | Masayoshi et al. |
| 6,150,748 A | 11/2000 | Fukiharu |
| 6,157,546 A | 12/2000 | Petty |
| 6,163,071 A | 12/2000 | Yamamura |
| 6,178,249 B1 | 1/2001 | Hietanen et al. |
| 6,191,928 B1 | 2/2001 | Rector et al. |
| 6,201,876 B1 | 3/2001 | Miemi et al. |
| 6,228,676 B1 | 5/2001 | Glenn et al. |
| 6,242,802 B1 | 6/2001 | Miles et al. |
| 6,262,477 B1 | 7/2001 | Mahulikar et al. |
| 6,282,072 B1 | 8/2001 | Minervini et al. |
| 6,282,781 B1 | 9/2001 | Gotoh et al. |
| 6,308,398 B1 | 10/2001 | Beavers |
| 6,324,067 B1 | 11/2001 | Nishiyama |
| 6,324,907 B1 | 12/2001 | Halteren et al. |
| 6,339,365 B1 | 1/2002 | Kawase et al. |
| 6,352,195 B1 | 3/2002 | Guthrie et al. |
| 6,388,887 B1 | 5/2002 | Matsumoto et al. |
| 6,401,542 B1 | 6/2002 | Kato |
| 6,403,881 B1 | 6/2002 | Hughes |
| 6,404,100 B1 | 6/2002 | Chujo et al. |
| 6,428,650 B1 | 8/2002 | Chung |
| 6,437,412 B1 | 8/2002 | Higuchi et al. |
| 6,439,869 B1 | 8/2002 | Seng et al. |
| 6,441,503 B1 | 8/2002 | Webster |
| 6,472,724 B1 | 10/2002 | Matsuzawa et al. |
| 6,479,320 B1 | 11/2002 | Gooch et al. |
| 6,483,037 B1 | 11/2002 | Moore et al. |
| 6,521,482 B1 | 2/2003 | Hyoudo et al. |
| 6,522,762 B1 | 2/2003 | Mullenborn et al. |
| 6,526,653 B1 | 3/2003 | Glenn et al. |
| 6,534,340 B1 | 3/2003 | Karpman et al. |
| 6,535,460 B2 | 3/2003 | Loeppert et al. |
| 6,552,469 B1 | 4/2003 | Pederson et al. |
| 6,594,369 B1 | 7/2003 | Une |
| 6,621,392 B1 | 9/2003 | Volant et al. |
| 6,664,709 B2 | 12/2003 | Irie |
| 6,675,471 B1 | 1/2004 | Kimura et al. |
| 6,781,231 B2 | 8/2004 | Minervini |
| 6,847,090 B2 | 1/2005 | Loeppert |
| 6,859,542 B2 | 2/2005 | Johannsen |
| 6,876,052 B1 | 4/2005 | Tasi |
| 6,928,718 B2 | 8/2005 | Carpenter |
| 6,936,918 B2 | 8/2005 | Karney |
| 6,962,829 B2 | 11/2005 | Glenn |
| 7,003,127 B1 | 2/2006 | Sjursen |
| 7,080,442 B2 | 7/2006 | Kawamura |
| 7,092,539 B2 | 8/2006 | Sheplak |
| 7,142,682 B2 | 11/2006 | Mullenborn |
| 7,166,910 B2* | 1/2007 | Minervini .............. B81B 7/0064 257/704 |
| 7,215,223 B2 | 5/2007 | Hattanda |
| 7,221,767 B2 | 5/2007 | Mullenborn |
| 7,242,089 B2 | 7/2007 | Minervini |
| 7,280,855 B2 | 10/2007 | Hawker |
| 7,297,567 B2 | 11/2007 | Loeppert |
| 7,381,589 B2 | 6/2008 | Minervini |
| 7,382,048 B2 | 6/2008 | Minervini |
| 7,434,305 B2* | 10/2008 | Minervini .............. B81B 7/0061 216/62 |
| 7,436,054 B2 | 10/2008 | Zhe |
| 7,439,616 B2 | 10/2008 | Minervini |
| 7,501,703 B2 | 3/2009 | Minervini |
| 7,537,964 B2 | 5/2009 | Minervini |
| RE40,781 E | 6/2009 | Johannsen et al. |
| 7,633,156 B2 | 12/2009 | Minervini |
| 7,927,927 B2 | 4/2011 | Quan et al. |
| 8,018,049 B2* | 9/2011 | Minervini .............. B81B 7/0061 257/704 |
| 8,103,025 B2 | 1/2012 | Mullenborn et al. |
| 8,121,331 B2* | 2/2012 | Minervini .............. B81B 7/0061 257/703 |
| 8,170,244 B2 | 5/2012 | Ryan et al. |
| 8,358,004 B2* | 1/2013 | Minervini .............. B81B 7/0061 257/704 |
| 8,450,817 B2 | 5/2013 | Minervini |
| 8,457,332 B2 | 6/2013 | Loeppert et al. |
| 8,526,665 B2 | 9/2013 | Lutz et al. |
| 8,594,347 B2 | 11/2013 | Ryan et al. |
| 8,617,934 B1 | 12/2013 | Minervini |
| 8,623,709 B1 | 1/2014 | Minervini |
| 8,623,710 B1 | 1/2014 | Minervini |
| 8,624,384 B1* | 1/2014 | Minervini .............. B81B 7/0061 257/704 |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,551 B1 | 1/2014 | Minervini |
| 8,629,552 B1 | 1/2014 | Minervini |
| 8,633,064 B1 | 1/2014 | Minervini |
| 8,652,883 B1 | 2/2014 | Minervini |
| 8,704,360 B1* | 4/2014 | Minervini .............. B81B 7/0061 257/704 |
| 8,765,530 B1 | 7/2014 | Minervini |
| 8,781,140 B2 | 7/2014 | Lautenschlager et al. |
| 8,791,531 B2 | 7/2014 | Loeppert et al. |
| 8,879,767 B2 | 11/2014 | Wickstrom |
| 8,969,980 B2 | 3/2015 | Lee |
| 8,987,030 B2 | 3/2015 | Loeppert et al. |
| 8,995,694 B2 | 3/2015 | Vos et al. |
| 9,006,880 B1 | 4/2015 | Minervini |
| 9,023,689 B1 | 5/2015 | Minervini |
| 9,024,432 B1 | 5/2015 | Minervini |
| 9,040,360 B1 | 5/2015 | Minervini |
| 9,051,171 B1 | 6/2015 | Minervini |
| 9,061,893 B1 | 6/2015 | Minervini |
| 9,067,780 B1 | 6/2015 | Minervini |
| 9,078,063 B2 | 7/2015 | Loeppert et al. |
| 9,096,423 B1 | 8/2015 | Minervini |
| 9,133,020 B1 | 9/2015 | Minervini |
| 9,137,595 B2 | 9/2015 | Lee |
| 9,139,421 B1 | 9/2015 | Minervini |
| 9,139,422 B1 | 9/2015 | Minervini |
| 9,148,731 B1* | 9/2015 | Minervini .............. B81B 7/0061 |
| 9,150,409 B1 | 10/2015 | Minervini |
| 9,301,075 B2 | 3/2016 | Friel et al. |
| 9,338,560 B1* | 5/2016 | Minervini .............. B81B 7/0061 |
| 9,693,133 B2* | 6/2017 | Minervini .............. B81B 7/0061 |
| 2002/0067663 A1 | 6/2002 | Loeppert et al. |
| 2002/0102004 A1 | 8/2002 | Minervini |
| 2003/0052404 A1 | 3/2003 | Thomas |
| 2003/0133588 A1 | 7/2003 | Pedersen |
| 2004/0032705 A1 | 2/2004 | Ma |
| 2004/0184632 A1 | 9/2004 | Minervini |
| 2004/0253760 A1 | 12/2004 | Zhang et al. |
| 2005/0018864 A1 | 1/2005 | Minervini |
| 2005/0069164 A1 | 3/2005 | Mutuswamy et al. |
| 2005/0185812 A1 | 8/2005 | Minervini |
| 2005/0218488 A1 | 10/2005 | Matsuo |
| 2006/0157841 A1 | 7/2006 | Minervini |
| 2007/0189568 A1 | 8/2007 | Wilk et al. |
| 2007/0215962 A1 | 9/2007 | Minervini et al. |
| 2008/0142475 A1 | 6/2008 | Loeppert et al. |
| 2008/0217709 A1 | 9/2008 | Minervini et al. |
| 2008/0247585 A1 | 10/2008 | Leidl et al. |
| 2011/0096945 A1 | 4/2011 | Furst et al. |
| 2012/0039499 A1 | 2/2012 | Ryan et al. |
| 2013/0108074 A1 | 5/2013 | Reining |
| 2013/0177192 A1 | 7/2013 | Abry et al. |
| 2014/0037115 A1 | 2/2014 | Vos et al. |
| 2014/0037120 A1 | 2/2014 | Lim et al. |
| 2014/0037124 A1 | 2/2014 | Lim et al. |
| 2014/0064546 A1 | 3/2014 | Szczech et al. |
| 2014/0133686 A1 | 5/2014 | Lee |
| 2014/0177113 A1 | 6/2014 | Gueorguiev et al. |
| 2014/0291783 A1 | 10/2014 | Talag et al. |
| 2014/0291784 A1 | 10/2014 | Conklin |
| 2014/0294209 A1 | 10/2014 | Szczech et al. |
| 2014/0321687 A1 | 10/2014 | Friel et al. |
| 2015/0117681 A1 | 4/2015 | Watson et al. |
| 2015/0139428 A1 | 5/2015 | Reining et al. |

(56) References Cited

U.S. PATENT DOCUMENTS

| | | |
|---|---|---|
| 2015/0166335 A1 | 6/2015 | Loeppert et al. |
| 2015/0172825 A1 | 6/2015 | Lim et al. |
| 2015/0195659 A1 | 7/2015 | Szczech et al. |
| 2015/0208165 A1 | 7/2015 | Volk et al. |
| 2015/0251898 A1 | 9/2015 | Vos et al. |

OTHER PUBLICATIONS

Kress, H.J. et al, "Integrated Silicon Pressure Sensor for Automotive Application with Electronic Trimming," SAE International, International Congress and Exposition, Detroit, Michigan (Feb. 27, 1995-Mar. 2, 1995).

Kristiansen, H. et al., "Fine Pitch Connection of Flexible Circuits to Rigid Substrates Using Non-Conductive Epoxy Adhesive", IEPS, pp. 759-773 (1991).

Lau, John, "Chip Scale Package Design, Materials, Process, Reliability, and Applications", McGraw-Hill(1999).

Lau, John, ed., "Ball Grid Array Technology", McGraw Hill, Inc., USA (1995).

Lloyd, R.H.F., "ASLT: An Extension of Hybrid-Miniaturization Techniques", IBM J. Res. Develop., 11(4), pp. 86-92 (1967).

Lomeson, .R.B, "High Technology Microcircuit Packaging", International Electronic Packaging Society Proceedings, pp. 498-503 (1982).

Bever, T. et al., "BICMOS Compatible Silicon Microphone Packaged as Surface Mount Device", Sensors Expo (1999).

Card, D., How ETA Chose to Make a Megaboard for its Supercomputer, pp. 50-52, Electron. Bus. (1988).

Chung, K., et al., "Z-Axis Conductive Adhesives for Fine Pitch Interconnections", ISHM Proceedings, DD. 678-689 (1992).

Commission Opinion, In the Matter of Certain Silicon Microphone Packages and Products Containing the Same, ITC Inv. No. 337-TA-629 (Aug. 18, 2009).

Complainant Knowles Electronics, LLC's Contingent Petition for Review of Final Initial Determination, Inv. No. 337-TA-888, U.S. Int'l Trade Commission, Sep. 17, 2014.

Complainant Knowles Electronics, LLC's Response to Petition for Review of Respondents Goertek Inc. and Goertek Electronics, Inc., Inv. No. 337-TA-888, U.S. Int'l Trade Commission, Sep. 29, 2014.

Complainant Knowles Electronics, LLC's Statement on the Public Interest Pursuant to 19 C.F.R. § 210.50(a)(4), Inv. No. 337-TA-888, U.S. Int'l Trade Commission, Oct. 2, 2014.

* cited by examiner

TOP PORT MULTI-PART SURFACE MOUNT SILICON CONDENSER MICROPHONE

CROSS-REFERENCE TO RELATED APPLICATIONS

This application is a continuation of U.S. patent application Ser. No. 15/135,125, filed Apr. 21, 2016, which is a continuation of U.S. patent application Ser. No. 14/836,499 (now U.S. Pat. No. 9,338,560), filed Aug. 26, 2015, which is a continuation of U.S. patent application Ser. No. 14/258,870 (now U.S. Pat. No. 9,148,731), filed Apr. 22, 2014, which is a continuation of U.S. patent application Ser. No. 13/732,179 (now U.S. Pat. No. 8,704,360), filed Dec. 31, 2012, which is a continuation of U.S. patent application Ser. No. 13/286,558 (now U.S. Pat. No. 8,358,004), filed Nov. 1, 2011, which is a continuation of U.S. patent application Ser. No. 13/111,537 (now U.S. Pat. No. 8,121,331), filed May 19, 2011, which is a continuation of U.S. patent application Ser. No. 11/741,881 (now U.S. Pat. No. 8,018,049), filed Apr. 30, 2007, which is a divisional of U.S. patent application Ser. No. 10/921,747 (now U.S. Pat. No. 7,434,305), filed Aug. 19, 2004, which is a continuation-in-part of U.S. patent application Ser. No. 09/886,854 (now U.S. Pat. No. 7,166,910), filed Jun. 21, 2001, which claims the benefit of U.S. Provisional Patent Application No. 60/253,543, filed Nov. 28, 2000. U.S. patent application Ser. No. 13/668,035, filed Nov. 2, 2012, U.S. patent application Ser. No. 13/668,103, filed Nov. 2, 2012, U.S. patent application Ser. No. 13/732,120, filed Dec. 31, 2012, U.S. patent application Ser. No. 13/732,205, filed Dec. 31, 2012, U.S. patent application Ser. No. 13/732,232, filed Dec. 31, 2012, and U.S. patent application Ser. No. 13/732,265, filed Dec. 31, 2012, are also continuations of U.S. patent application Ser. No. 13/286,558 (now U.S. Pat. No. 8,358,004). The above-identified applications are hereby incorporated by reference herein in their entireties for all purposes.

TECHNICAL FIELD

This patent relates generally to a housing for a transducer. More particularly, this patent relates to a silicon condenser microphone including a housing for shielding a transducer.

BACKGROUND

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPs and small outline integrated circuit (SOIC) packages have been utilized. However, the drawbacks associated with manufacturing these housings, such as lead time, cost, and tooling, make these options undesirable.

SUMMARY

The present invention is directed to a silicon condenser microphone package that allows acoustic energy to contact a transducer disposed within a housing. The housing provides the necessary pressure reference while at the same time protects the transducer from light, electromagnetic interference, and physical damage. In accordance with an embodiment of the invention a silicon condenser microphone includes a transducer and a substrate and a cover forming the housing. The substrate may have an upper surface with a recess formed therein allowing the transducer to be attached to the upper surface and to overlap at least a portion of the recess thus forming a back volume. The cover is placed over the transducer and includes an aperture adapted for allowing sound waves to reach the transducer.

Other features and advantages of the invention will be apparent from the following specification taken in conjunction with the following drawings.

DETAILED DESCRIPTION

Figure 1:
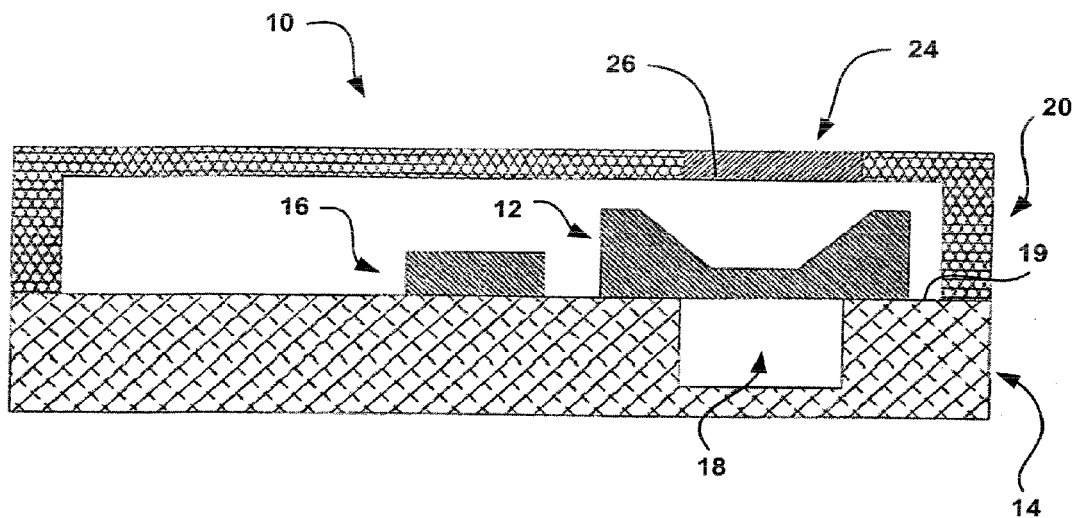
FIG. 1 is a cross-sectional view of a first embodiment of a silicon condenser microphone of the present invention.

While the invention is susceptible of embodiments in many different forms, there is shown in the drawings and will herein be described in detail several possible embodiments of the invention with the understanding that the present disclosure is to be considered as an exemplification of the principles of the invention and is not intended to limit the broad aspect of the invention to the embodiments illustrated.

The present invention is directed to microphone packages. The benefits of the microphone packages disclosed herein over microphone packaging utilizing plastic body/lead frames include the ability to process packages in panel form allowing more units to be formed per operation and at much lower cost. The typical lead frame for a similarly functioning package would contain between 40 and 100 devices connected together. The present disclosure would have approximately 14,000 devices connected together (as a panel). Also, the embodiments disclosed herein require minimal "hard-tooling" This allows the process to adjust to custom layout requirements without having to redesign mold, lead frame, and trim/form tooling.

Moreover, many of the described embodiments have a better match of thermal coefficients of expansion with the end user's PCB, typically made of FR-4, since the microphone package is also made primarily of FR-4. These embodiments of the invention may also eliminate the need for wire bonding that is required in plastic body/lead frame packages. The footprint is typically smaller than that would be required for a plastic body/lead frame design since the leads may be formed by plating a through-hole in a circuit board to form the pathway to the solder pad. In a typical plastic body/lead frame design, a (gull wing configuration would be used in which the leads widen the overall foot print.

Figure 2:
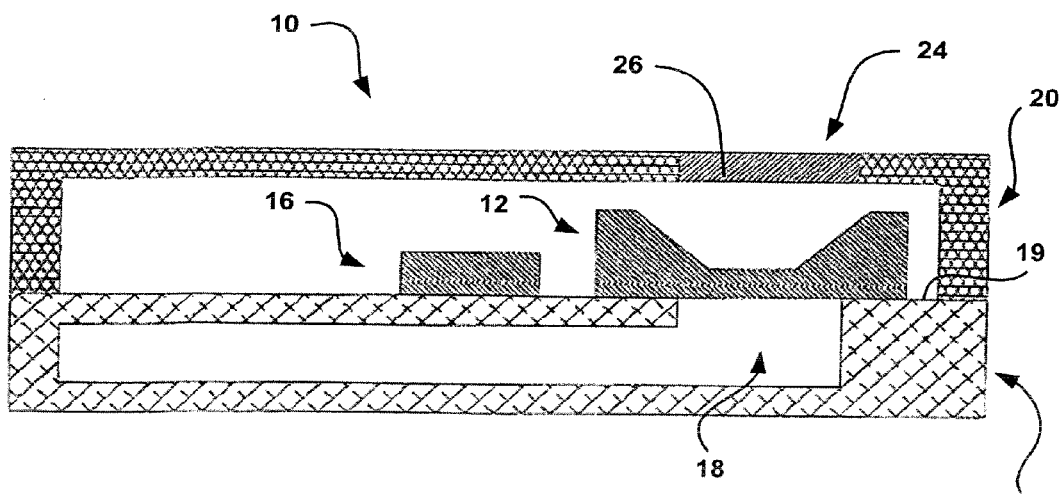
FIG. 2 is a cross-sectional view of a second embodiment of a silicon condenser microphone of the present invention.
Figure 3:
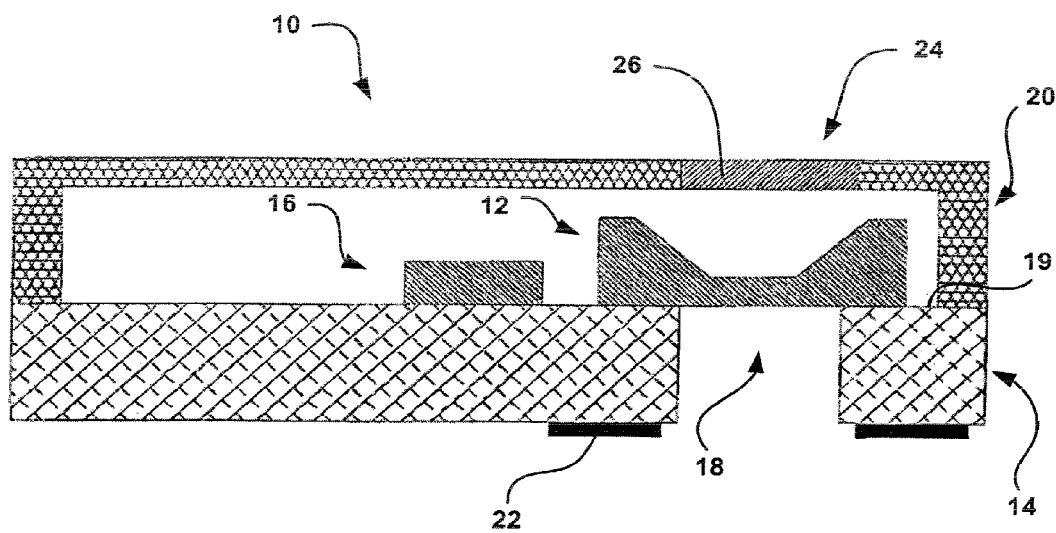
FIG. 3 is a cross-sectional view of a third embodiment of a silicon condenser microphone of the present invention.
Figure 6:
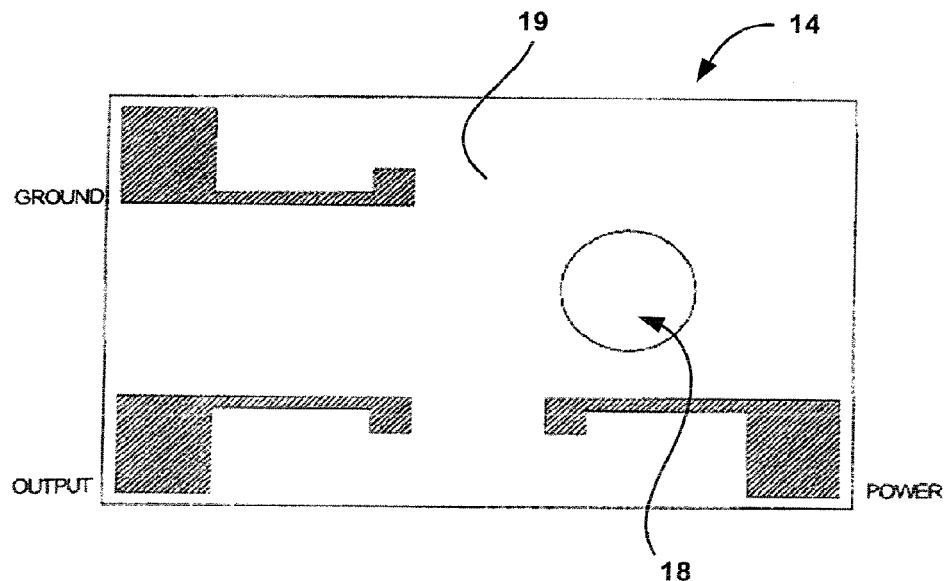
FIG. 6 is a plan view of a substrate to which a silicon condenser microphone is fixed.
Figure 7:
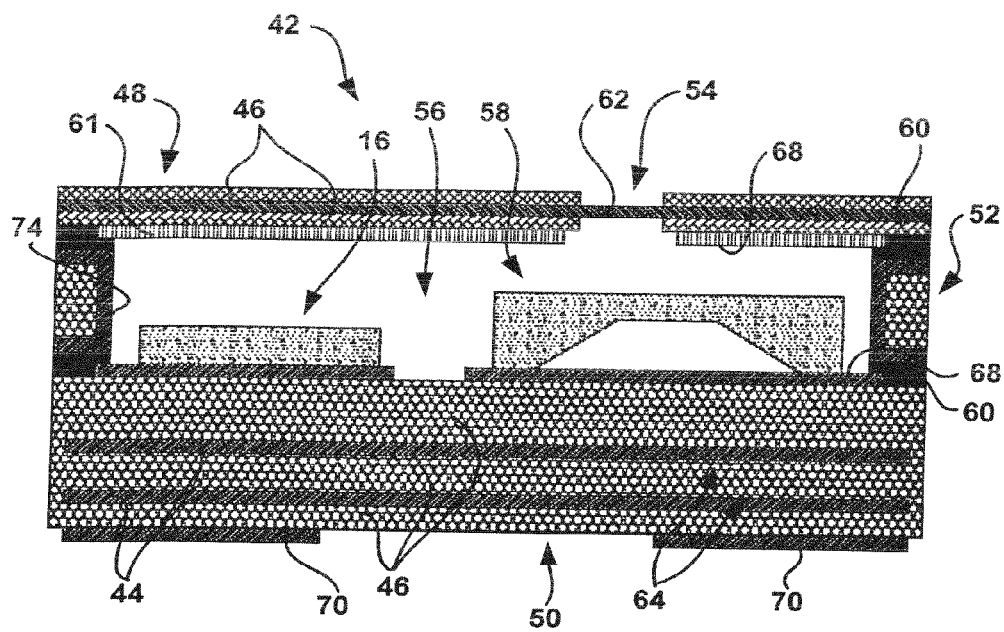
FIG. 7 is a longitudinal cross-sectional view of a microphone package of the present invention.
Figure 8:
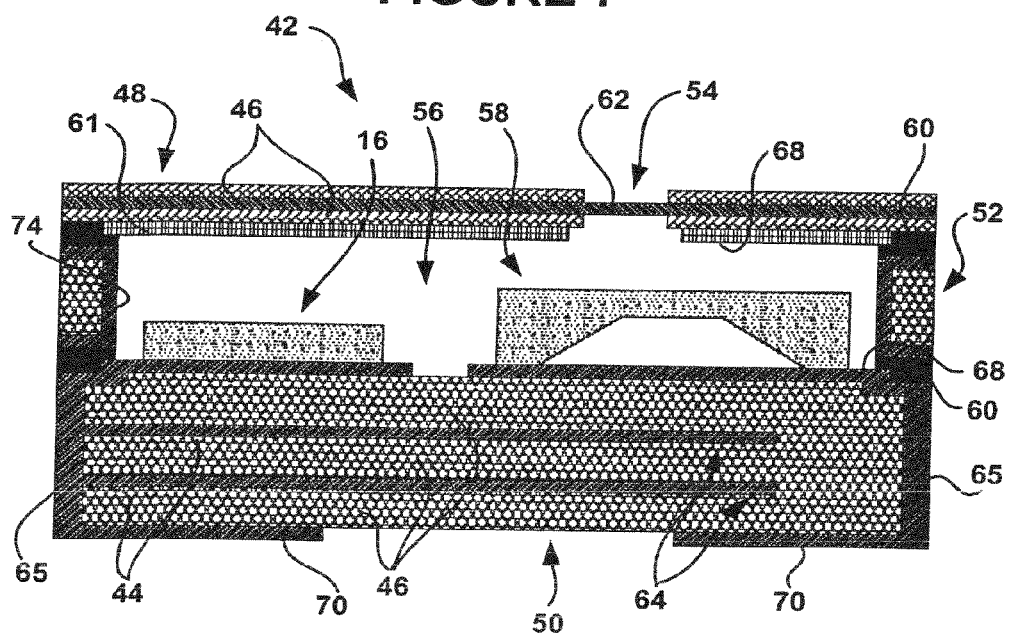
FIG. 8 is a lateral cross-sectional view of a microphone package of the present invention.
Figure 9:
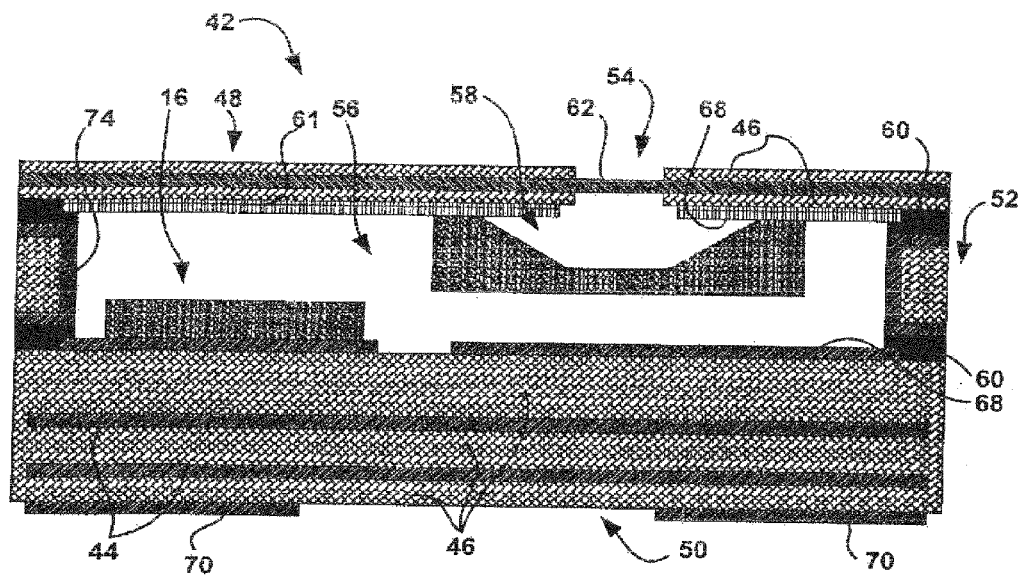
FIG. 9 is a longitudinal cross-sectional view of a microphone package of the present invention.
Figure 10:
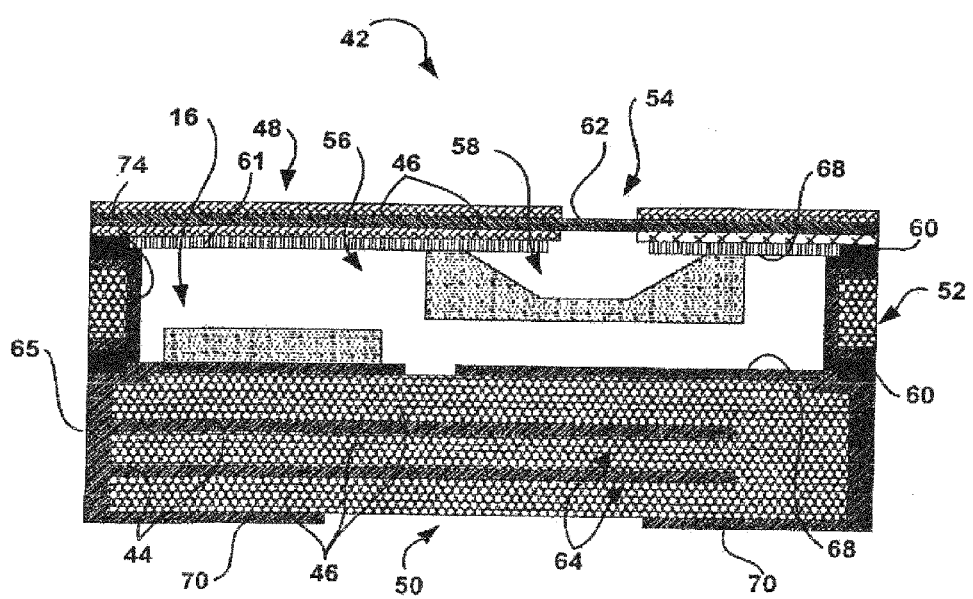
FIG. 10 is a lateral cross-sectional view of a microphone package of the present invention.

Now, referring to FIGS. 1-3, three embodiments of a silicon condenser microphone package 10 of the present invention are illustrated. Included within silicon microphone package 10 is a transducer 12, e.g. a silicon condenser microphone as disclosed in U.S. Pat. No. 5,870,482 which is hereby incorporated by reference and an amplifier 16. The package itself includes a substrate 14, a back volume or air cavity 18, which provides a pressure reference for the transducer 12, and a cover 20. The substrate 14 may be formed of FR-4 material allowing processing in circuit board panel form, thus taking advantage of economies of scale in manufacturing. FIG. 6 is a plan view of the substrate 14 showing the back volume 18 surrounded a plurality of terminal pads.

Figure 4:
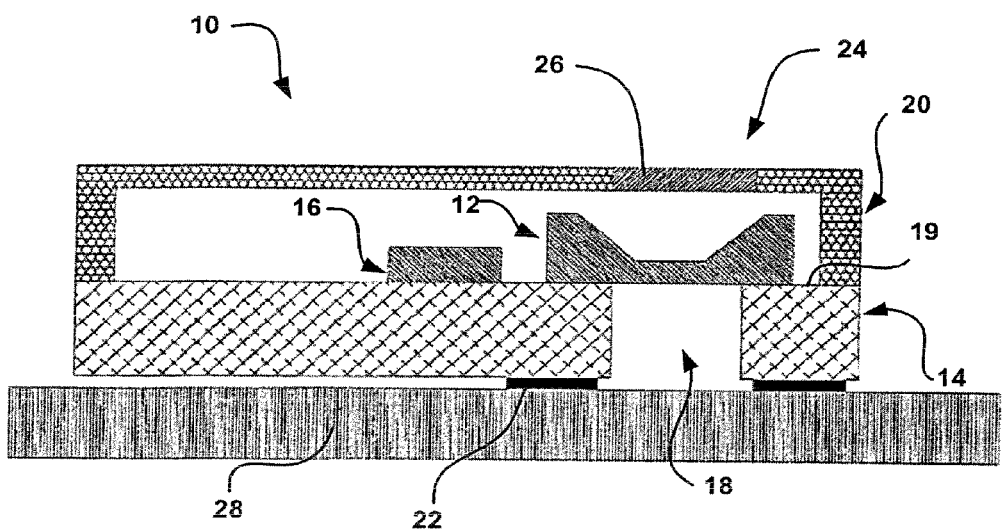
FIG. 4 is a cross-sectional view of the third embodiment of the present invention affixed to an end user circuit board.
Figure 5:
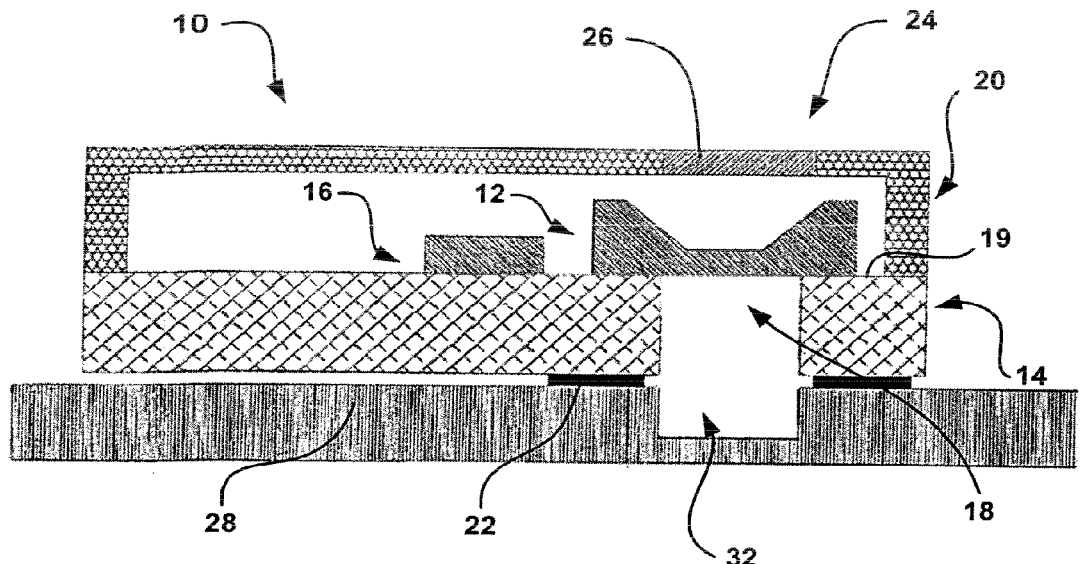
FIG. 5 is a cross-sectional view of the third embodiment of the present invention affixed to an end user circuit board in an alternate fashion.

The back volume 18 may be formed by a number of methods, including controlled depth drilling of an upper surface 19 of the substrate 14 to form a recess over which the transducer 12 is mounted (FIG. 1); drilling and routing of several individual sheets of FR-4 and laminating the individual sheets to form the back volume 18, which may or may not have internal support posts (FIG. 2); or drilling completely through the substrate 14 and providing a sealing ring 22 on the bottom of the device that will seal the back volume 18 during surface mounting to a user's "board" 28 (FIGS. 3-5). In this example, the combination of the substrate and the user's board 28 creates the back volume 18. The back volume 18 is covered by the transducer 12 (e.g., a MEMS device) which may be "bumpbonded" and mounted face down. The boundary is sealed such that the back volume 18 is operably "air-tight."

The cover 20 is attached for protection and processability. The cover 20 contains an aperture 24 which may contain a sintered metal insert 26 to prevent water, particles and/or light from entering the package and damaging the internal components inside; i.e. semiconductor chips. The aperture 24 is adapted for allowing sound waves to reach the transducer 12. The sintered metal insert 26 will also have certain acoustic properties, e.g. acoustic damping or resistance. The sintered metal insert 26 may therefore be selected such that its acoustic properties enhance the functional capability of the transducer 12 and/or the overall performance of the silicon microphone 10.

Referring to FIGS. 4 and 5 the final form of the product is a silicon condenser microphone package 10 which would most likely be attached to an end user's PCB 28 via a solder reflow process. FIG. 5 illustrates a method of enlarging the back volume 18 by including a chamber 32 within the end user's circuit board 28.

Another embodiment of a silicon condenser microphone package 40 of the present invention is illustrated in FIGS. 7-10. In this embodiment, a housing 42 is formed from layers of materials, such as those used in providing circuit boards. Accordingly, the housing 42 generally comprises alternating layers of conductive and non-conductive materials 44, 46. The non-conductive layers 46 are typically FR-4 board. The conductive layers 44 are typically copper. This multi-layer housing construction advantageously permits the inclusion of circuitry, power and ground planes, solder pads, ground pads, capacitance layers and plated through holes pads within the structure of the housing itself. The conductive layers provide EMI shielding while also allowing configuration as capacitors and/or inductors to filter input/output signals and/or the input power supply.

In the embodiment illustrated, the housing 42 includes a top portion 48 and a bottom portion 50 spaced by a side portion 52. The housing 42 further includes an aperture or acoustic port 54 for receiving an acoustic signal and an inner chamber 56 which is adapted for housing a transducer unit 58, typically a silicon die microphone or a ball grid array package (BGA). The top, bottom, and side portions 48, 50, 52 are electrically connected, for example with a conductive adhesive 60. The conductive adhesive may be provided conveniently in the form of suitably configured sheets of dry adhesive disposed between the top, bottom and side portions 48, 50 and 52. The sheet of dry adhesive may be activated by pressure, heat or other suitable means after the portions are brought together during assembly. Each portion may comprise alternating conductive and non-conductive layers of 44, 46.

The chamber 56 may include an inner lining 61. The inner lining 61 is primarily formed by conductive material. It should be understood that the inner lining may include portions of non-conductive material, as the conductive material may not fully cover the non-conductive material. The inner lining 61 protects the transducer 58 against electromagnetic interference and the like, much like a faraday cage. The inner lining 61 may also be provided by suitable electrically coupling together of the various conductive layers within the top, bottom and side portions 48, 50 and 52 of the housing.

In the various embodiments illustrated in FIGS. 7-10 and 23-26, the portions of the housing 42 that include the aperture or acoustic port 54 further include a layer of material that forms an environmental barrier 62 over or within the aperture 54. This environmental barrier 62 is typically a polymeric material formed to a film, such as a polytetrafluoroethylene (PTFE) or a sintered metal. The environmental barrier 62 is supplied for protecting the chamber 56 of the housing 42, and, consequently, the transducer unit 58 within the housing 42, from environmental elements such as sunlight, moisture, oil, dirt, and/or dust. The environmental barrier 62 will also have inherent acoustic properties, e.g. acoustic damping/resistance. Therefore the environmental barrier 62 is chosen such that its acoustic properties cooperate with the transducer unit 58 to enhance the performance of the microphone. This is particularly true in connection with the embodiments illustrated in FIGS. 24 and 25, which may be configured to operate as directional microphones.

The environmental barrier layer 62 is generally sealed between layers of the portion, top 48 or bottom 50 in which the acoustic port 54 is formed. For example, the environmental barrier may be secured between layers of conductive material 44 thereby permitting the layers of conductive material 44 to act as a capacitor (with electrodes defined by the metal) that can be used to filter input and output signals or the input power. The environmental barrier layer 62 may further serve as a dielectric protective layer when in contact with the conductive layers 44 in the event that the conductive layers also contain thin film passive devices such as resistors and capacitors.

In addition to protecting the chamber 56 from environmental elements, the barrier layer 62 allows subsequent wet processing, board washing of the external portions of the housing 42, and electrical connection to ground from the walls via thru hole plating. The environmental barrier layer 62 also allows the order of manufacturing steps in the fabrication of the printed circuit board-based package to be modified. This advantage can be used to accommodate different termination styles. For example, a double sided package can be fabricated having a pair of apertures 54 (see FIG. 25), both including an environmental barrier layer 62. The package would look and act the same whether it is mounted face up or face down, or the package could be mounted to provide directional microphone characteristics. Moreover, the environmental barrier layer 62 may also be selected so that its acoustic properties enhance the directional performance of the microphone.

Referring to FIGS. 7, 8, and 11-13 the transducer unit 58 is generally not mounted to the top portion 48 of the housing. This definition is independent of the final mounting orientation to an end user's circuit board. It is possible for the top portion 48 to be mounted face down depending on the orientation of the transducer 58 as well as the choice for the bottom portion 50. The conductive layers 44 of the top portion 48 may be patterned to form circuitry, ground planes, solder pads, ground pads, capacitors and plated through hole pads. Referring to FIGS. 1-13 there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 11:
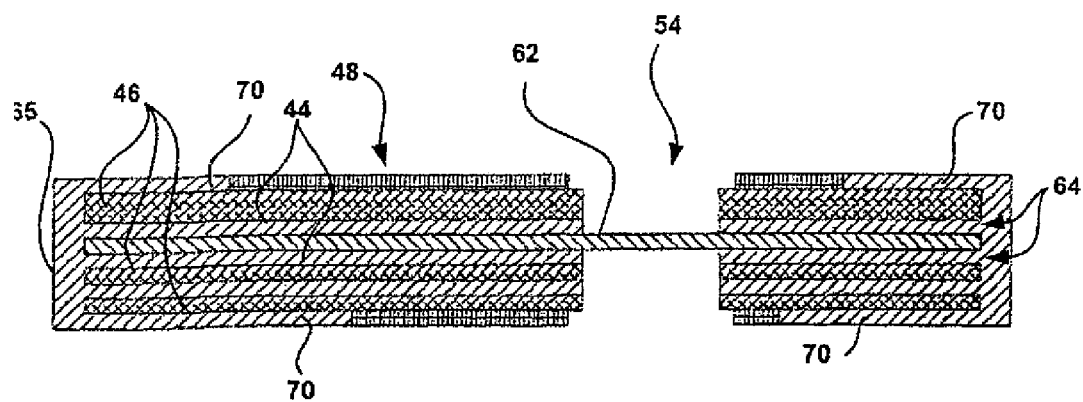
FIG. 11 is a cross-sectional view of a top portion for a microphone package of the present invention.

FIG. 11 illustrates an alternative top portion 48 for a microphone package. In this embodiment, a connection between the layers can be formed to provide a conduit to ground. The top portion of FIG. 11 includes ground planes and/or pattern circuitry 64 and the environmental barrier 62. The ground planes and or pattern circuitry 64 are connected by pins 65.

Figure 12:
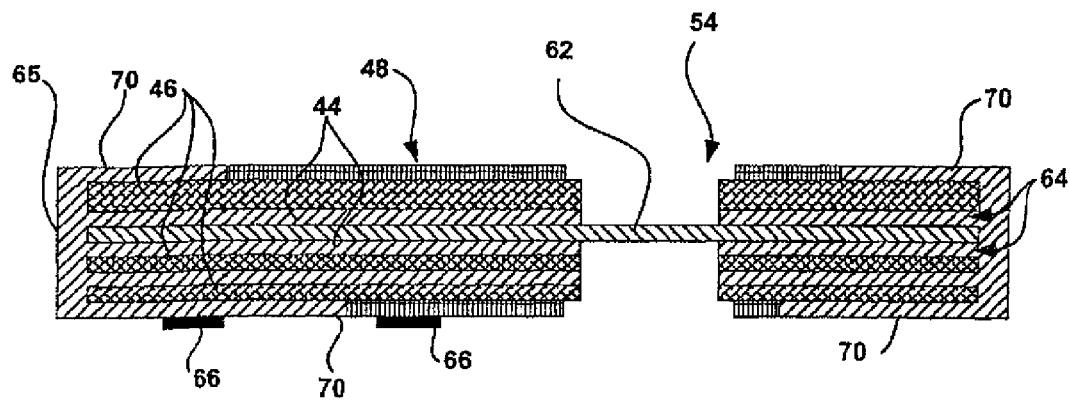
FIG. 12 is a cross-sectional view of a top portion for a microphone package of the present invention.

FIG. 12 illustrates another embodiment of a top portion 48. In addition to the connection between layers, ground planes/pattern circuitry 64, and the environmental barrier 62, this embodiment includes conductive bumps 66 (e.g. Pb/Sn or Ni/Au) patterned on the bottom side to allow secondary electrical contact to the transducer 58. Here, conductive circuitry would be patterned such that electrical connection between the bumps 66 and a plated through hole termination is made.

Figure 13:
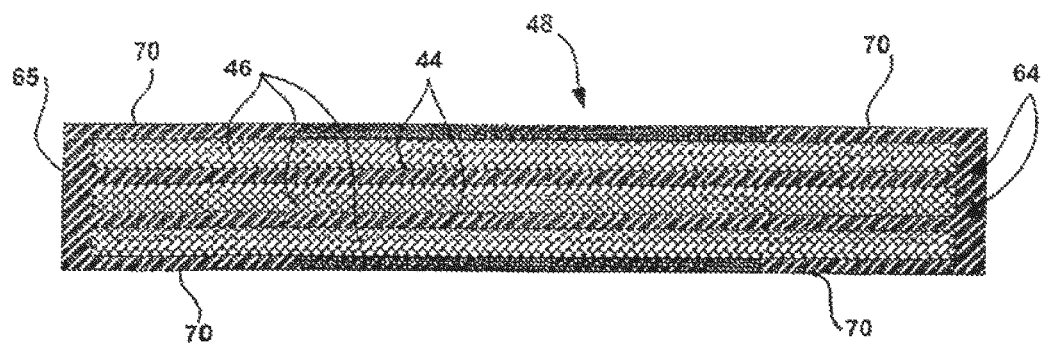
FIG. 13 is a cross-sectional view of a top portion for a microphone package of the present invention.

FIG. 13 illustrates yet another embodiment of the top portion 48. In this embodiment, the top portion 48 does not include an aperture or acoustic port 54.

Referring to FIGS. 7, 8 and 14-18, the bottom portion 50 is the component of the package to which the transducer 58 is primarily mounted. This definition is independent of the final mounting orientation to the end user's circuit board. It is possible for the bottom portion 50 to be mounted facing upwardly depending on the mounting orientation of the transducer 58 as well as the choice for the top portion 48 construction. Like the top portion 48, the conductive layers 44 of the bottom portion 50 may be patterned to form circuitry, ground planes, solder pads, ground pads, capacitors and plated through hole pads. As shown in FIGS. 14-18, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 14A:
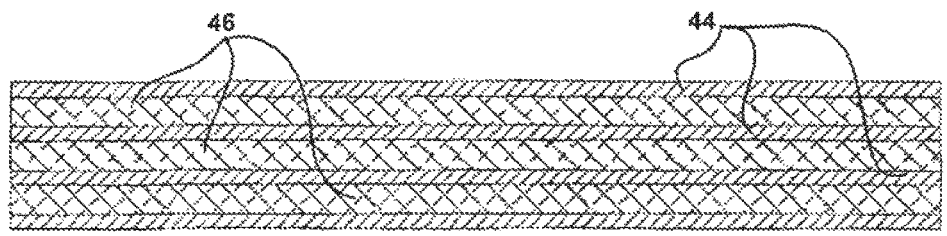
FIG. 14A is a cross-sectional view of a laminated bottom portion of a housing for a microphone package of the present invention.
Figure 14B:
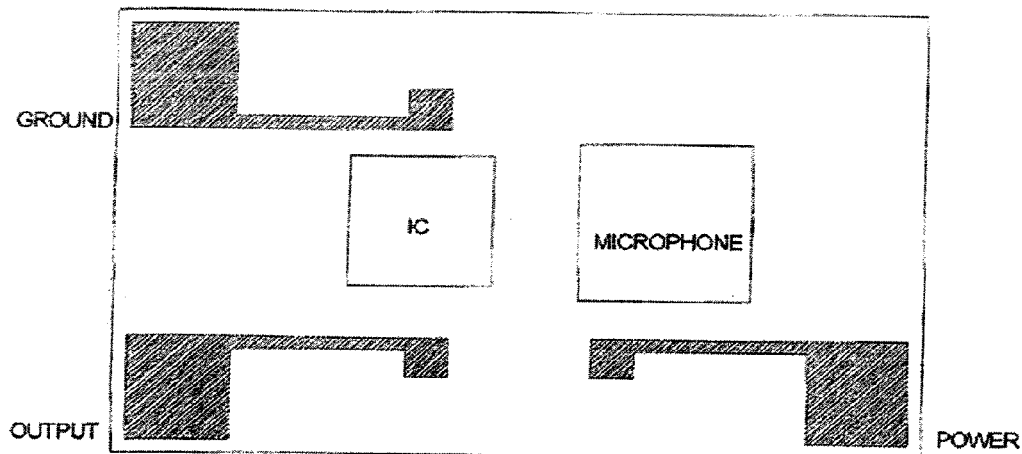
FIG. 14B is a plan view of a layer of the laminated bottom portion of FIG. 14A.

Referring to FIGS. 14A through 14D, the bottom portion 50 comprises a laminated, multi-layered board including layers of conductive material 44 deposited on layers of non-conductive material 46. Referring to FIG. 14B, the first layer of conductive material is used to attach wire bonds or flip chip bonds. This layer includes etched portions to define lead pads, bond pads, and ground pads. The pads would have holes drilled through them to allow the formation of plated through-holes.

Figure 14C:
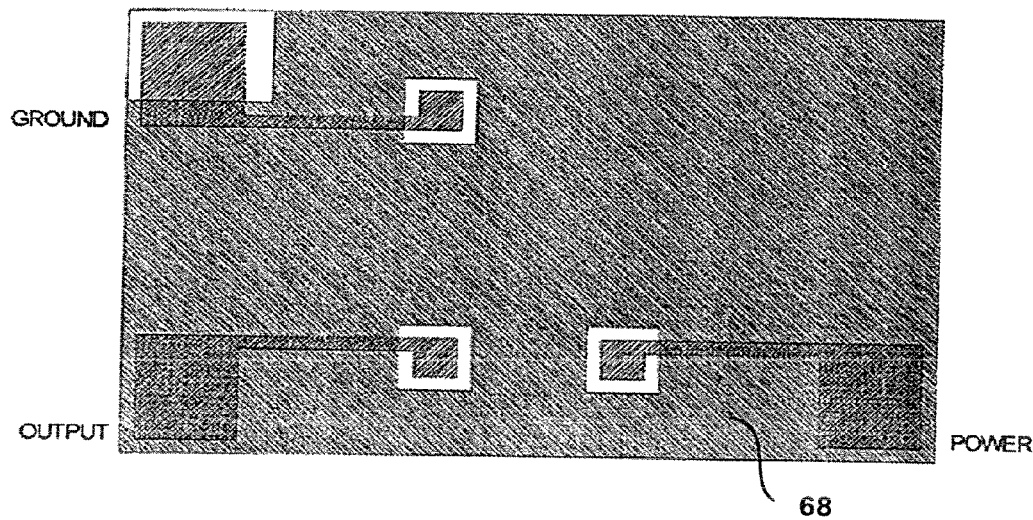
FIG. 14C is a plan view of a layer of the laminated bottom portion of FIG. 14A.

As shown in FIG. 14C, a dry film 68 of non-conductive material covers the conductive material. This illustration shows the exposed bonding pads as well as an exposed ground pad. The exposed ground pad would come in electrical contact with the conductive epoxy and form the connection to ground of the side portion 52 and the base portion 50.

Figure 14D:
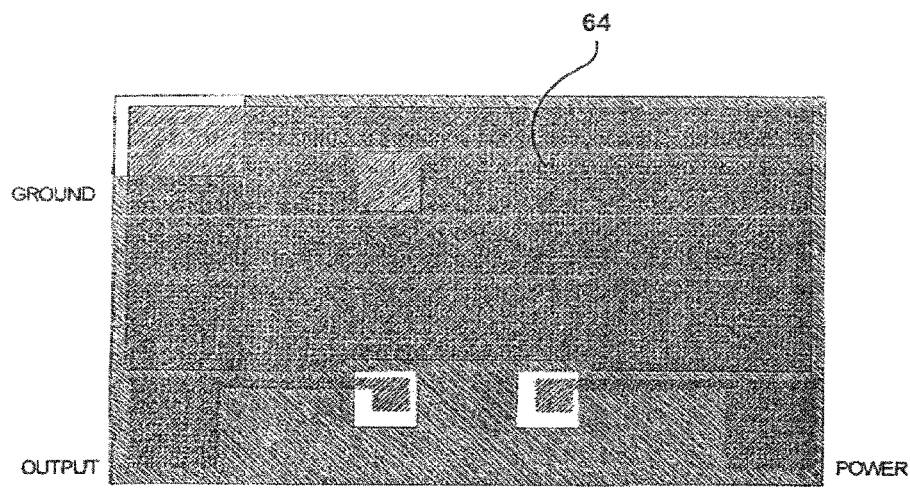
FIG. 14D is a plan view of a layer of the laminated bottom portion of FIG. 14A.

Referring to FIG. 14D, ground layers can be embedded within the base portion 50. The hatched area represents a typical ground plane 64. The ground planes do not overlap the power or output pads, but will overlap the transducer 58.

Figure 15:
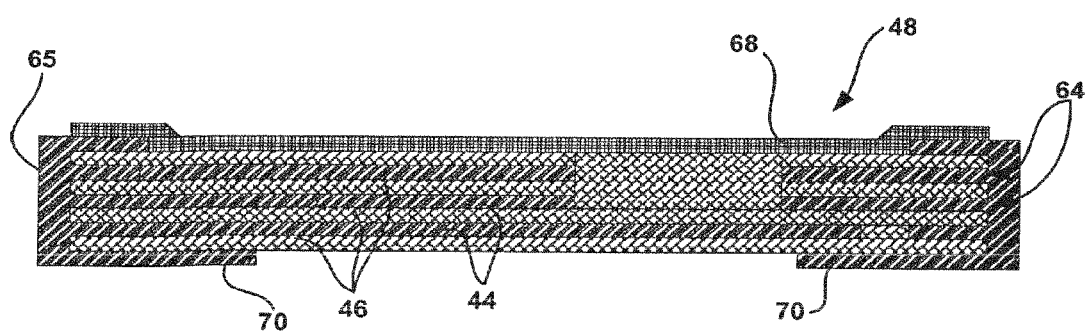
FIG. 15 is a cross-sectional view of a bottom portion for a microphone package of the present invention.

Referring to FIG. 15, an embodiment of the bottom portion 50 is illustrated. The bottom portion 50 of this embodiment includes a solder mask layer 68 and alternating layers of conductive and non-conductive material 44, 46. The bottom portion further comprises solder pads 70 for electrical connection to an end user's board.

Figure 16:
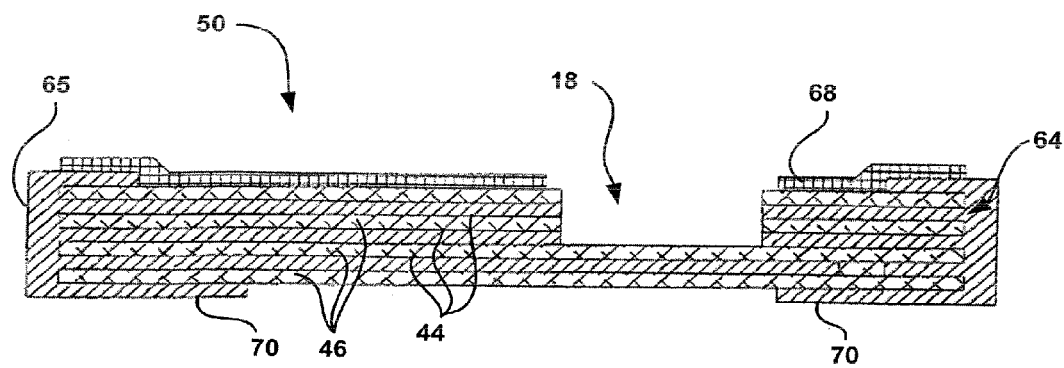
FIG. 16 is a cross-sectional view of a bottom portion for a microphone package of the present invention.
Figure 17:
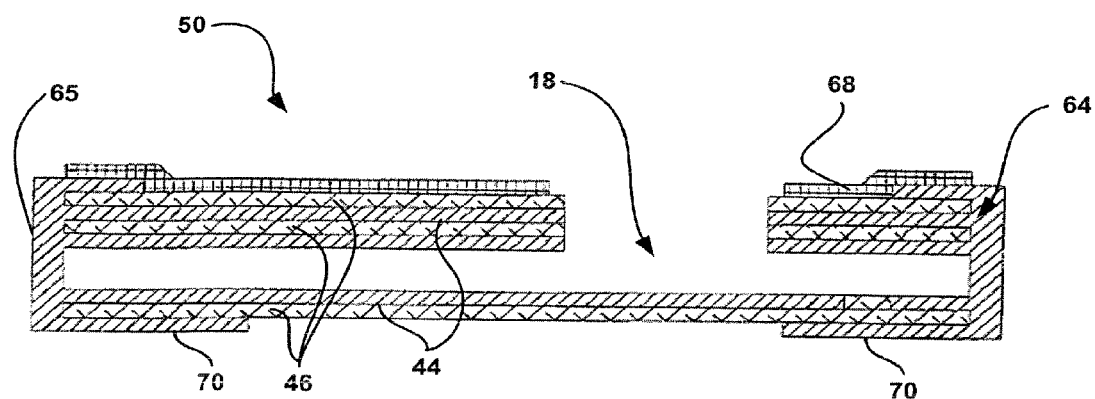
FIG. 17 is a cross-sectional view of a bottom portion for a microphone package of the present invention.

FIGS. 16 and 17 illustrate embodiments of the bottom portion 50 with enlarged back volumes 18. These embodiments illustrate formation of the back volume 18 using the conductive/non-conductive layering.

Figure 18:
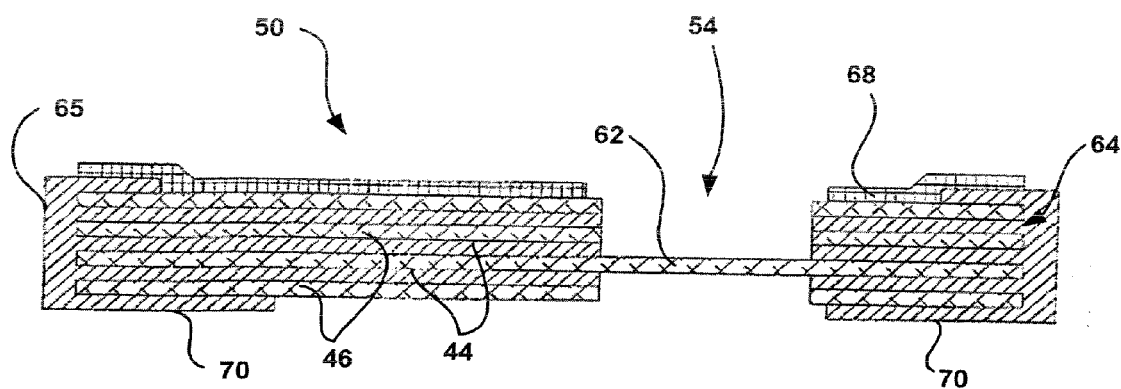
FIG. 18 is a cross-sectional view of a bottom portion for a microphone package of the present invention.

FIG. 18 shows yet another embodiment of the bottom portion 50. In this embodiment, the back portion 50 includes the acoustic port 54 and the environmental barrier 62.

Referring to FIGS. 7-10 and 19-22, the side portion 52 is the component of the package that joins the bottom portion 50 and the top portion 48. The side portion 52 may include a single layer of a non-conductive material 46 sandwiched between two layers of conductive material 44. The side portion 52 forms the internal height of the chamber 56 that houses the transducer 58. The side portion 52 is generally formed by one or more layers of circuit board material, each having a routed window 72 (see FIG. 19).

Figure 19:
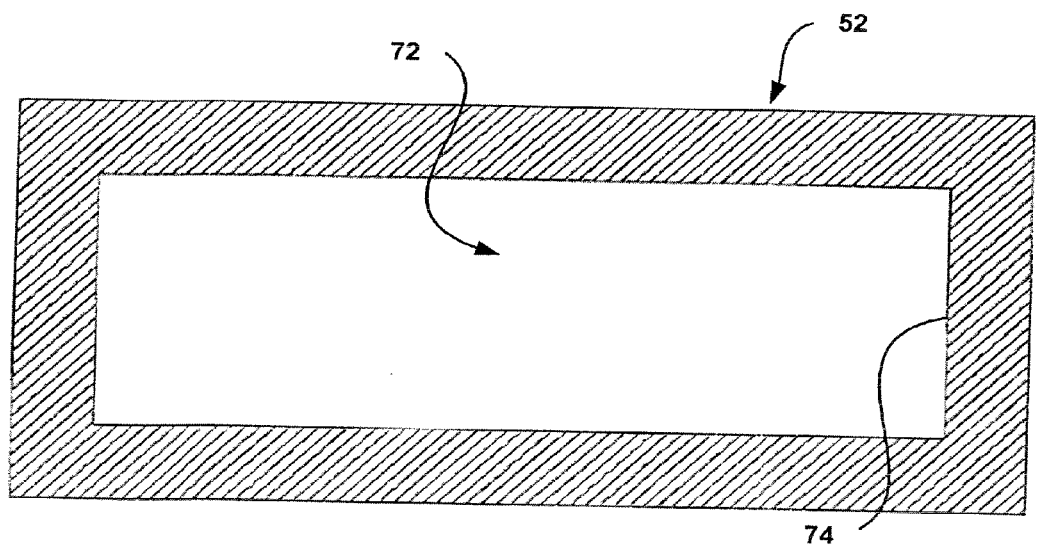
FIG. 19 is a plan view of a side portion for a microphone package of the present invention.
Figure 20:
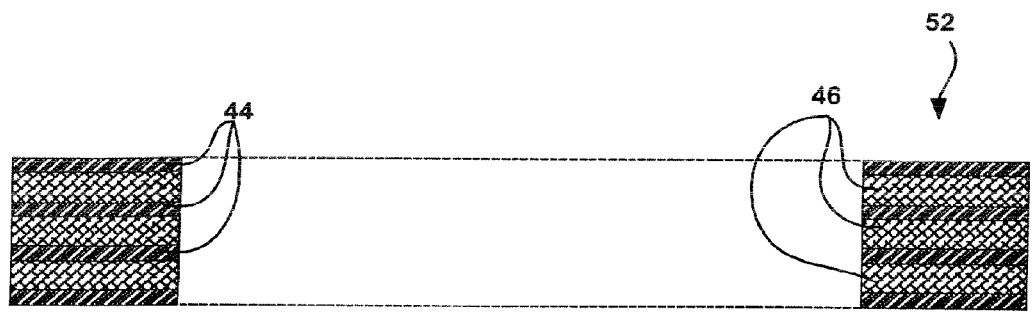
FIG. 20 is a cross-sectional view of a side portion for a microphone package of the present invention.
Figure 21:
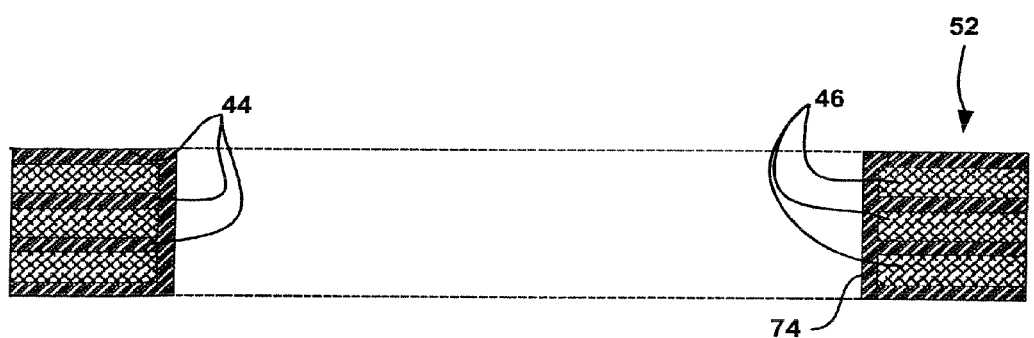
FIG. 21 is a cross-sectional view of a side portion for a microphone package of the present invention.
Figure 22:
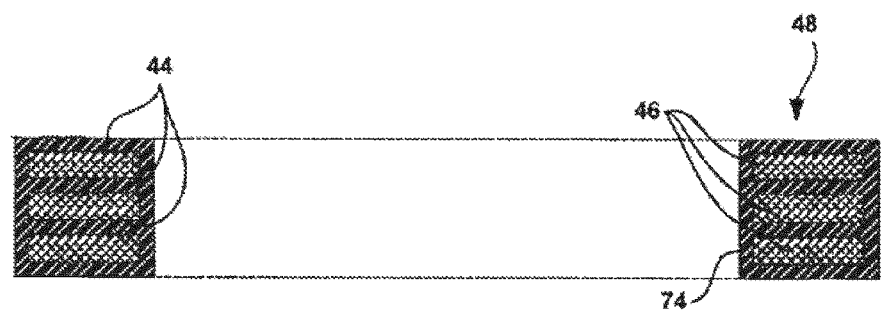
FIG. 22 is a cross-sectional view of a side portion for a microphone package of the present invention.

Referring to FIGS. 19-22, the side portion 52 includes inner sidewalls 74. The inner sidewalls 74 are generally plated with a conductive material, typically copper, as shown in FIGS. 20 and 21. The sidewalls 74 are formed by the outer perimeter of the routed window 72 and coated/metallized with a conductive material.

Alternatively, the sidewalls 74 may be formed by may alternating layers of non-conductive material 46 and conductive material 44, each having a routed window 72 (see FIG. 19). In this case, the outer perimeter of the window 72 may not require coverage with a conductive material because the layers of conductive material 44 would provide effective shielding.

FIGS. 23-26 illustrate various embodiments of the microphone package 40. These embodiments utilize top, bottom, and side portions 48, 50, and 52 which are described above. It is contemplated that each of the top, bottom, and side portion 48, 50, 52 embodiments described above can be utilized in any combination without departing from the invention disclosed and described herein.

Figure 23:
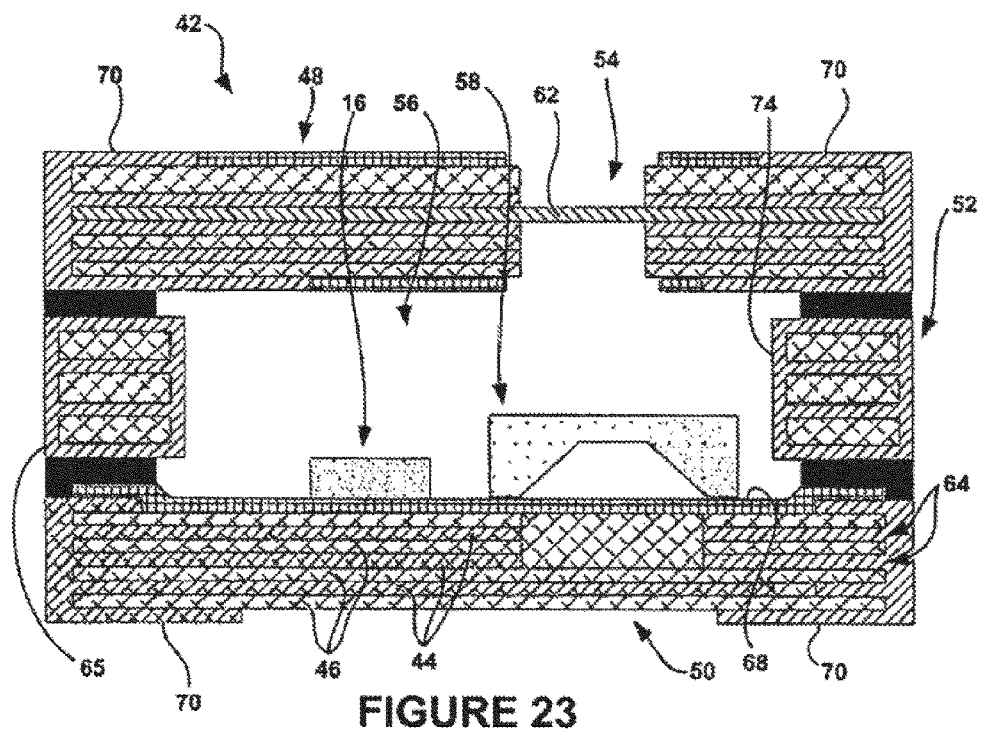
FIG. 23 is a cross-sectional view of a microphone package of the present invention.

In FIG. 23, connection to an end user's board is made through the bottom portion 50. The package mounting orientation is bottom portion 50 down. Connection from the transducer 58 to the plated through holes is be made by wire bonding. The transducer back volume 18 is formed by the back hole (mounted down) of the silicon microphone only. Bond pads, wire bonds and traces to the terminals are not shown. A person of ordinary skilled in the art of PCB design will understand that the traces reside on the first conductor layer 44. The wire bonds from the transducer 58 are be connected to exposed pads. The pads are connected to the solder pads via plated through holes and traces on the surface.

Figure 24:
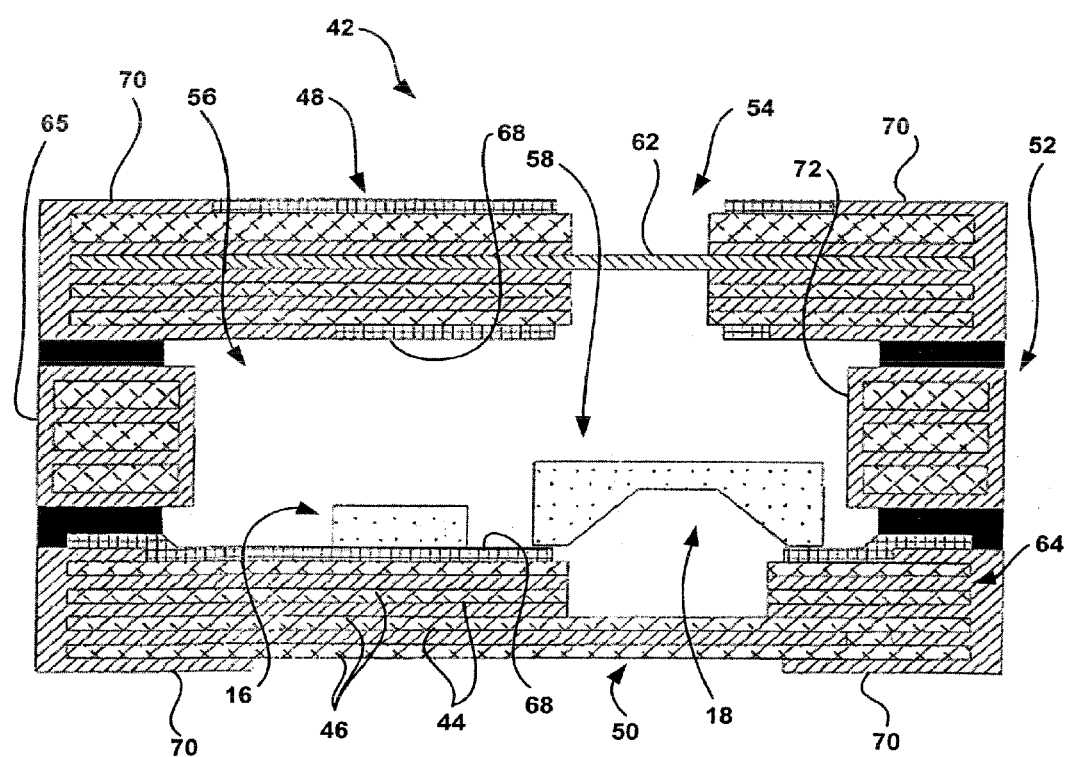
FIG. 24 is a cross-sectional view of a microphone package of the present invention.

In FIG. 24, connection to the end user's board is also made through the bottom portion 50. Again, the package mounting orientation is bottom portion 50. Connection from the transducer 58 to the plated through holes are made by wire bonding. The back volume is formed by a combination of the back hole of the transducer 58 (mounted down) and the bottom portion 50.

Figure 25:
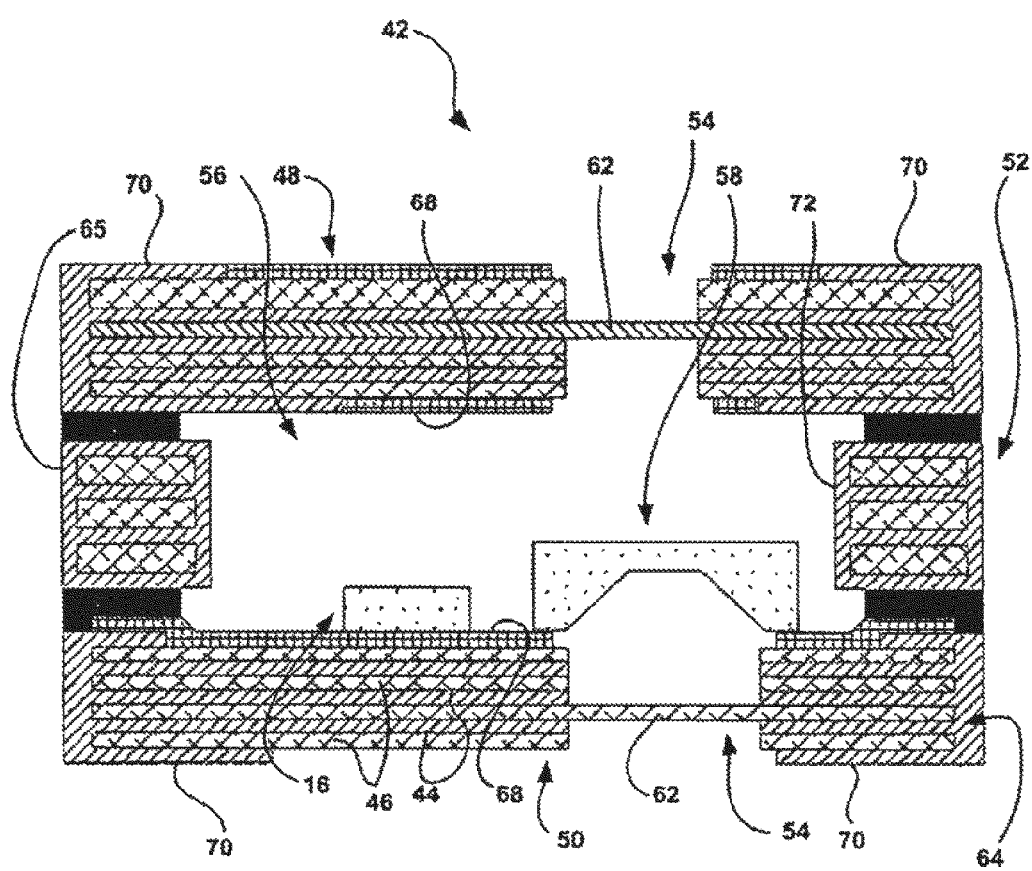
FIG. 25 is a cross-sectional view of a microphone package of the present invention.

In FIG. 25, connection to the end user's board is also made through the bottom portion 50. Again, the package mounting orientation is bottom portion 50. Connection from the transducer 58 to the plated through holes are made by wire bonding. With acoustic ports 54 on both sides of the package, there is no back volume. This method is suitable to a directional microphone.

Figure 26:
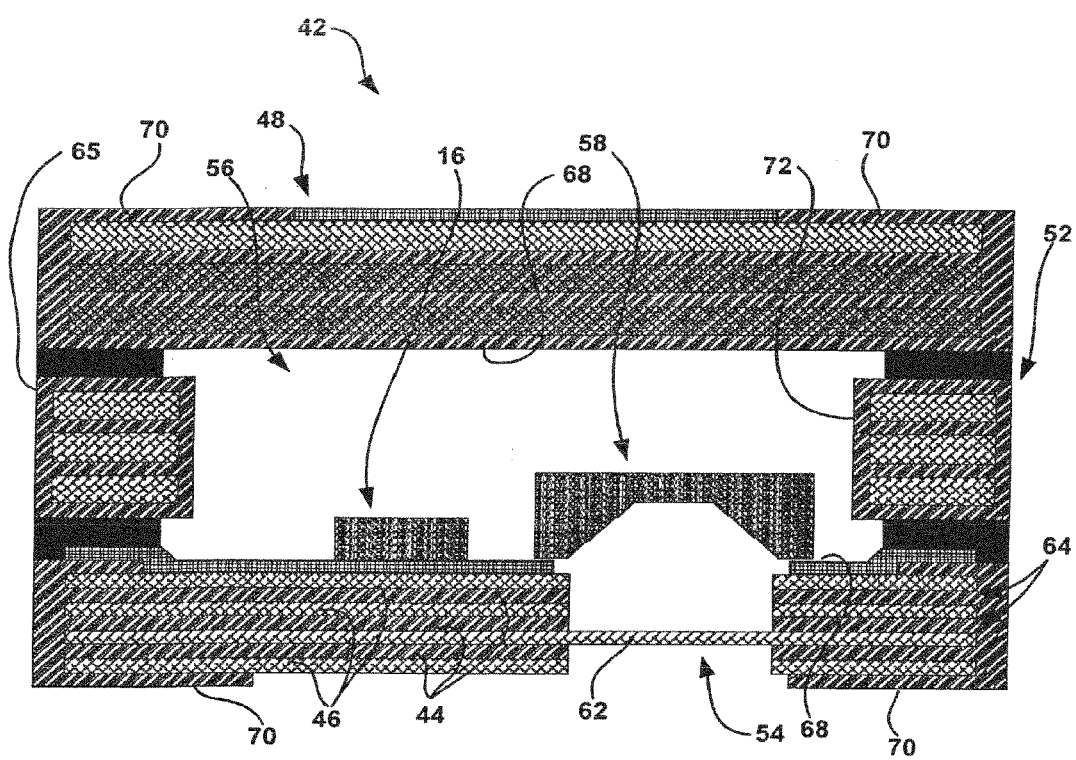
FIG. 26 is a cross-sectional view of a microphone package of the present invention.

In FIG. 26, connection to the end user's board is made through the top portion 48 or the bottom portion 53. The package mounting orientation is either top portion 48 down or bottom portion 50 down. Connection from the transducer 58 to the plated through holes is made by flip chipping or wire bonding and trace routing. The back volume 18 is formed by using the air cavity created by laminating the bottom portion 50 and the top portion 48 together. Some portion of the package fabrication is performed after the transducer 58 has been attached. In particular, the through hole formation, plating, and solder pad definition would be done after the transducer 58 is attached. The protective membrane 62 is hydrophobic and prevents corrosive plating chemistry from entering the chamber 56.

Figure 27:
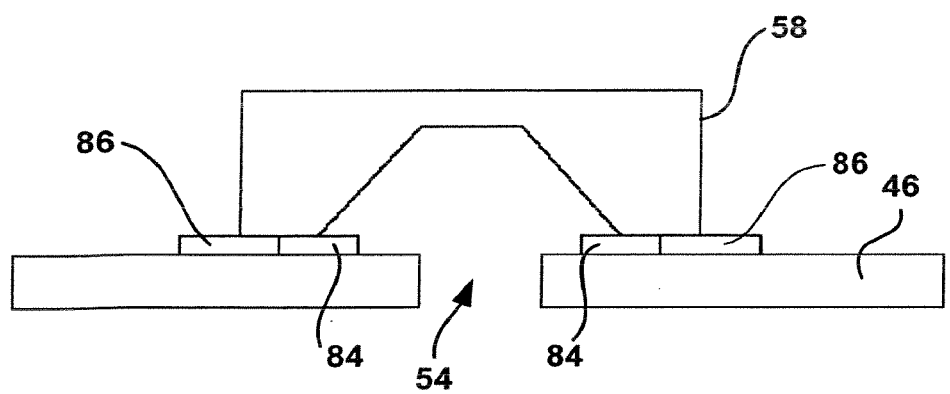
FIG. 27 is a cross-sectional view of a microphone package of the present invention with a retaining ring.
Figure 28:
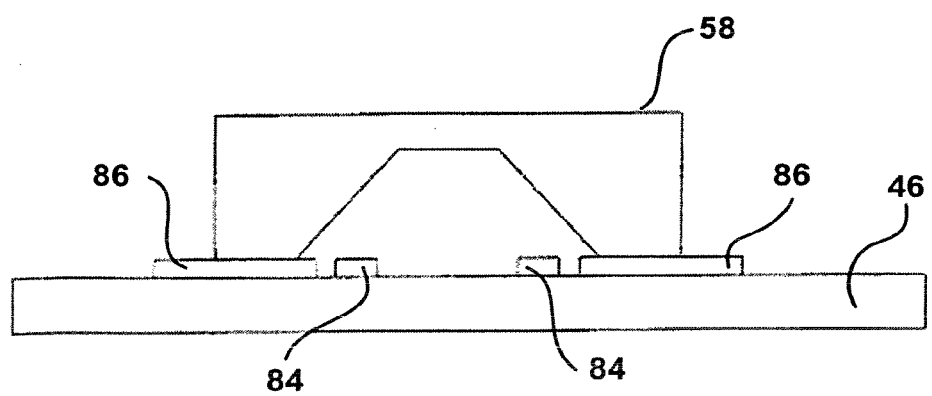
FIG. 28 is a cross-sectional view of a microphone package of the present invention with a retaining wing.
Figure 29:
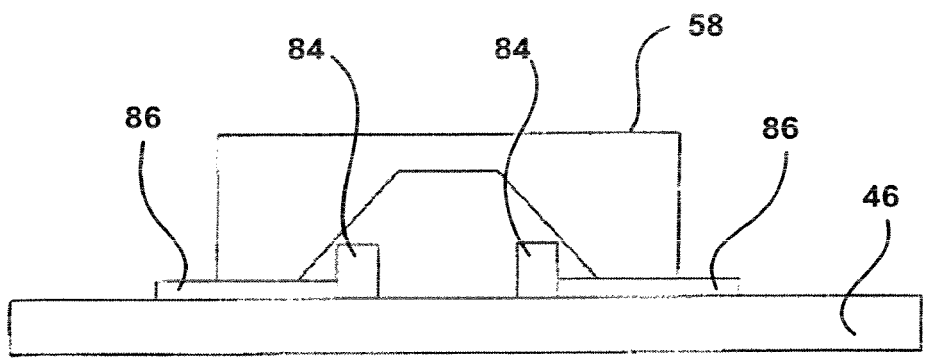
FIG. 29 is a cross-sectional view of a microphone package of the present invention with a retaining ring.

Referring to FIGS. 27-29, the portion to which the transducer unit 58 is mounted may include a retaining ring 84. The retaining ring 84 prevents wicking of an epoxy 86 into the transducer 58 and from flowing into the acoustic port or aperture 54. Accordingly, the shape of the retaining ring 84 will typically match the shape of the transducer 58 foot print. The retaining ring 84 comprises a conductive material (e.g., 3 mil. thick copper) imaged on a non-conductive layer material.

Referring to FIG. 27, the retaining ring 84 is imaged onto a nonconductive layer. An epoxy is applied outside the perimeter of the retaining ring 84, and the transducer 58 is added so that it overlaps the epoxy 86 and the retaining ring 84. This reduces epoxy 86 wicking up the sides of the transducer's 58 etched port (in the case of a silicon die microphone).

Alternatively, referring to FIG. 28, the retaining ring 84 can be located so that the transducer 58 does not contact the retaining ring 84. In this embodiment, the retaining ring 84 is slightly smaller than the foot print of the transducer 58 so that the epoxy 86 has a restricted path and is, thus, less likely to wick. In FIG. 29, the retaining ring 84 is fabricated so that it contacts the etched port of the transducer 58. The following tables provide an illustrative example of a typical circuit board processing technique for fabrication of the housing of this embodiment.

TABLE 1

Materials

| Material | Type | Component | Note |
|---|---|---|---|
| 1 | 0.5/0.5 oz. DST Cu 5 core FR-4 | Bottom Portion (Conductive Layers Non-Conductive Layer 1) | |
| 2 | 0.5/0.5 oz. DST Cu 5 core FR-4 | Bottom Portion (Conductive Layers 3 and 4; Non-Conductive Layer 2) | |
| 3 | 106 pre-preg | | For Laminating Material 1 and Material 2 |
| 4 | 0.5/0.5 oz. DST Cu 40 Core FR-4 | Side Portion | Metallized Afterward |
| 5 | Bare/0.5 oz. Cu 2 core FR-4 (2 pieces) | Top Portion (Each Piece Includes 1 Conductive and 1 Non-Conductive Layer) | |

TABLE 1-continued

Materials

| Material | Type | Component | Note |
|---|---|---|---|
| 6 | Expanded PTFE | Environmental Barrier | |

TABLE 2

Processing of Materials (Base Portion Material 1)

| Step | Type | Description | Note |
|---|---|---|---|
| 1 | Dry Film Conductive Layers | | |
| 2 | Expose | Mask Material 1 (Upper Conductive Layer) | Forms Ground Plane on Lower Conductive Layer |
| 3 | Develop | | |
| 4 | Etch Cu | | No Etching on Upper Conductive Layer |
| 5 | Strip Dry Film | | |

TABLE 3

Processing of (Bottom Portion Material 2)

| Step | Type | Description | Note |
|---|---|---|---|
| 1 | Dry Film Conductive Layers | | |
| 2 | Expose | Mask Material 2 (Upper Conductive Layer) | Forms Ground Plane on Upper Conductive Layer |
| 3 | Develop | | |
| 4 | Etch Cu | | No Etching on Upper Conductive Layer |
| 5 | Strip Dry Film | | |

TABLE 4

Processing of Materials 1, 2, and 3 (Form Bottom Portion)

| Step | Type | Description | Note |
|---|---|---|---|
| 1 | Laminate | Materials 1 and 2 Laminated Using Material 3 | |
| 2 | Drill Thru Holes | Drill Bit = 0.025 in. | |
| 3 | Direct Metallization/Flash Copper | Plates Thru Holes | |
| 4 | Dry Film (L1 and L4) | | Forms Traces and Solder Pads |
| 5 | Expose | Mask Laminated Materials 1 and 2 (Upper and Lower Conductive Layers) | |
| 6 | Develop | | |
| 7 | Electrolytic Cu | 1.0 mil | |
| 8 | Electrolytic Sn | As Required | |
| 9 | Strip Dry Film | | |
| 10 | Etch Cu | | |
| 11 | Etch Sn | | |
| 12 | Insert Finishing Option Here | NG Option (See Table Below) | NG Option for Proof of Principle |
| 13 | Dry Film (cover lay) on Upper Conductive Layer Only | 2.5 mil | Minimum Thickness on Upper Conductive Layer |
| 14 | Expose | Mask Laminated Materials 1 and 2 (upper and lower) | This mask defines an area on the upper conductive layer that will receive a dry film solder mask (cover lay). The bottom layer will not have dry film applied to it. The plated through holes will be bridged over by the coating on the top. |
| 15 | Develop | | |
| 16 | Cure | | Full Cure |
| 17 | Route Panels | Route Bit = As Required | Forms 4" × 4" pieces. Conforms to finished dims |

Table 5 describes the formation of the side portion 52. This process involves routing a matrix of openings in FR-4 board. However, punching is thought to be the cost effective method for manufacturing. The punching may done by punching through the entire core, or, alternatively, punching several layers of no-flow pre-preg and thin core c-stage which are then laminated to form the wall of proper thickness.

After routing the matrix, the board will have to be electroless or DM plated. Finally, the boards will have to be routed to match the bottom portion. This step can be done first or last. It may make the piece more workable to perform the final routing as a first step.

TABLE 5

Processing of Material 4 (Side Portion)

| Step | Type | Description | Note |
|---|---|---|---|
| 1 | Route/Punch Matrix of Openings | Route Bit = 0.031 in. | Forms Side Portion |
| 2 | Direct Metallization/Flash Cu | 0.25 mil minimum | Forms Sidewalls on Side Portion |
| 3 | Route Panels | | |

Table 6 describes the processing of the top portion. The formation of the top portion 48 involves imaging a dry film cover lay or liquid solder mask on the bottom (i.e. conductive layer forming the inner layer. The exposed layer of the top portion 48 will not have a copper coating. It can be processed this way through etching or purchased this way as a one sided laminate.

A matrix of holes is drilled into the lid board. Drilling may occur after the imaging step. If so, then a suitable solder mask must be chosen that can survive the drilling process.

TABLE 6

Processing of Top Portion

| Step | Type | Description | Note |
|---|---|---|---|
| 1 | Dry Film | Conductive Layer | |
| 2 | Expose | Mask Bare Layer | Form Conduction Ring |
| 3 | Develop | | |
| 4 | Cure | | |
| 5 | Drill Matrix of Holes | Drill Bit 0.025 in. | Acoustic Ports |
| 6 | Laminate | PTFE (Environmental Barrier) Between 2 Pieces of Material 5 | Forms Top Portion |

TABLE 7

Processing of Laminated Materials 1 and 2 with Material 4

| Step | Type | Description | Note |
|---|---|---|---|
| 1 | Screen Conductive Adhesive on Material 4 | | |
| 2 | Laminate | Bottom Portion with Side Portion | Forms Bottom Portion with Side Portion (spacer) |
| 3 | Add Transducer Assembly | Silicon Die Microphone and Integrated Circuit | |

TABLE 8

Processing of Laminated Materials 1, 2, and 4 with Material 5

| Step | Type | Description | Note |
|---|---|---|---|
| 1 | Screen Conductive Adhesive on Top Portion | | |
| 2 | Laminate | Bottom Portion and Side Portion with Top Portion | Forms Housing |
| 3 | Dice | | |

TABLE 9

Finishing Option NG (Nickel/Gold)

| Step | Type | Description | Note |
|---|---|---|---|
| 1 | Immersion Ni (40-50, μ-in) | | |
| 2 | Immersion Au (25-30, μ-in) | | |

TABLE 10

Finishing Option NGT (Nickel/Gold/Tin)

| Step | Type |
|---|---|
| 1 | Mask L2 (using thick dry film or high tack dicing tape) |
| 2 | Immersion Ni (40-50, μ-in) |
| 3 | Immersion Au (25-30, μ-in) |
| 4 | Remove Mask on L2 |
| 5 | Mask L1 (using thick dry film or high tack dicing tape) bridge over cavity created by wall |
| 6 | Immersion Sn (100-250, μ-in) |
| 7 | Remove Mask on L1 |

TABLE 11

Finishing Option ST (Silver/Tin)

| Step | Type |
|---|---|
| 1 | Mask L2 (using thick dry film or high tack dicing tape) |
| 2 | Immersion Ag (40-50 μ-in) |
| 3 | Remove Mask on L2 |
| 4 | Mask L1 (using thick dry film or high tack dicing tape) bridge over cavity created by wall |
| 5 | Immersion Sn (100-250 μ-in) |
| 6 | Remove Mask on L1 |

Figure 30:
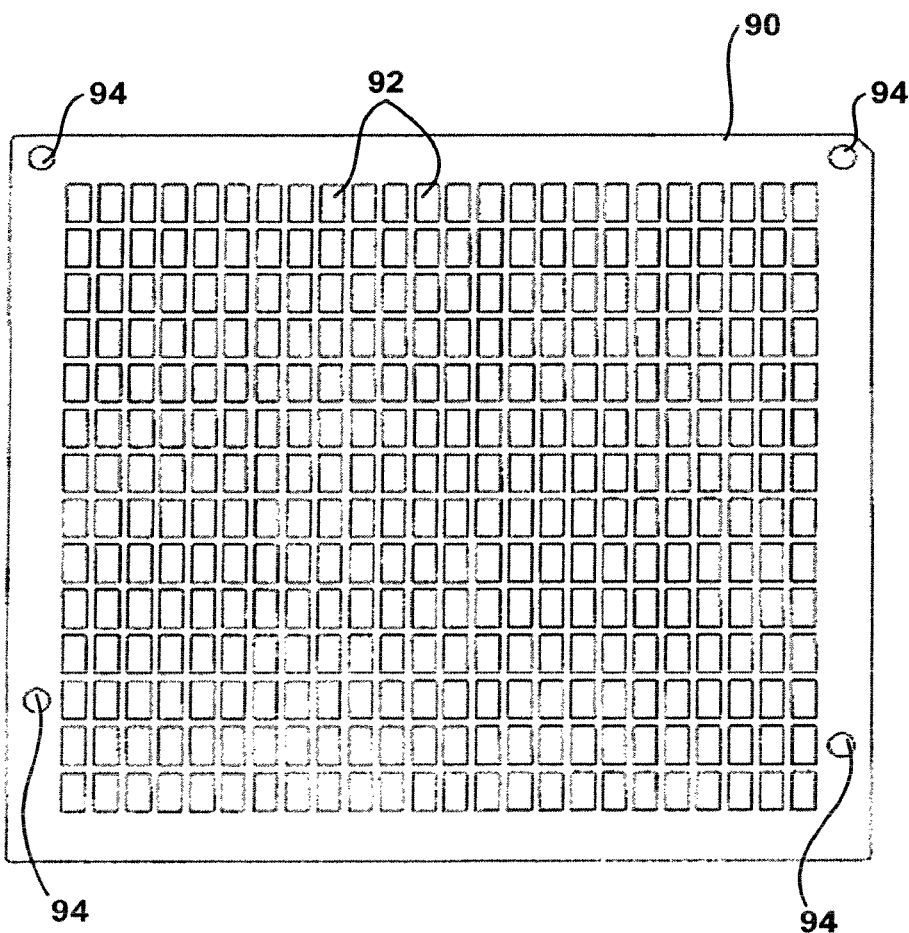
FIG. 30 is a plan view of a panel of a plurality of microphone packages.

FIG. 30 is a plan view illustrating a panel 90 for forming a plurality of microphone packages 92. The microphone packages 92 are distributed on the panel 90 in a 14×24 array, or 336 microphone packages total. Fewer or more microphone packages may be disposed on the panel 90, or on smaller or larger panels. As described herein in connection with the various embodiments of the invention, the microphone packages include a number of layers, such as top, bottom and side portions of the housing, environmental barriers, adhesive layers for joining the portions, and the like. To assure alignment of the portions as they are brought together, each portion may be formed to include a plurality of alignment apertures 94. To simultaneously manufacture several hundred or even several thousand microphones, a bottom layer, such as described herein, is provided. A transducer, amplifier and components are secured at appropriate locations on the bottom layer corresponding to each of the microphones to be manufactured. An adhesive layer, such as a sheet of dry adhesive is positioned over the bottom layer, and a sidewall portion layer is positioned over the adhesive layer. An additional dry adhesive layer is positioned, followed by an environmental barrier layer, another dry adhesive layer and the top layer. The dry adhesive layers are activated, such as by the application of heat and/or pressure. The panel is then separated into individual microphone assemblies using known panel cutting and separating techniques.

Figure 31:
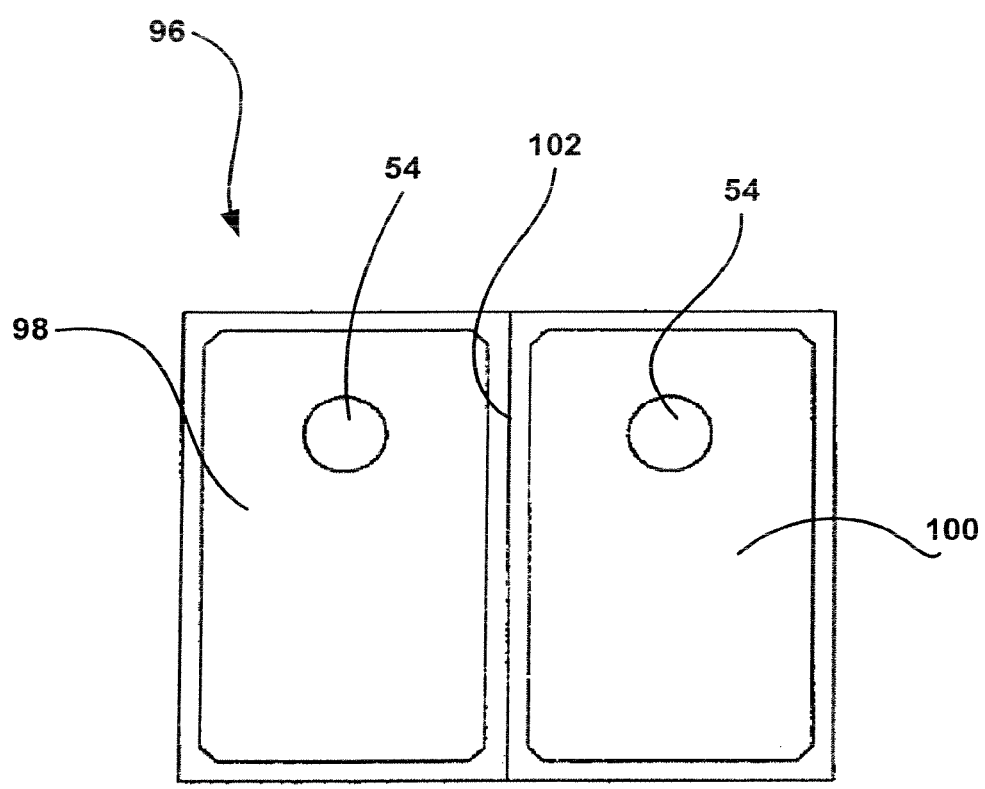
FIG. 31 is a plan view of a microphone pair.

The microphone, microphone package and method of assembly herein described further allow the manufacture of multiple microphone assembly, such as microphone pairs. In the simplest form, during separation two microphones may be left joined together, such as the microphone pair 96 shown in FIG. 31. Each microphone 98 and 100 of the microphone pair 96 is thus a separate, individually operable microphone in a single package sharing a common sidewall 102. Alternatively, as described herein, conductive traces may be formed in the various layers of either the top or bottom portion thus allowing multiple microphones to be electrically coupled.

While specific embodiments have been illustrated and described, numerous modifications come to mind without significantly departing from the spirit of the invention, and the scope of protection is only limited by the scope of the accompanying Claims.

What is claimed is:

1. A silicon condenser microphone comprising:
means for electrically interfacing to a printed circuit board comprising:
a top layer comprising a first conductive layer with a first non-conductive layer disposed on a lower surface of the first conductive layer, wherein the first conductive layer is patterned to form a plurality of conductive pads;

a bottom layer comprising a second non-conductive layer with a second conductive layer disposed on a lower surface of the second non-conductive layer, wherein the second conductive layer is patterned to form a plurality of flat solder pads, wherein the top and bottom layers are in facing relation to each other; and one or more electrical paths disposed completely within the means for electrically interfacing, wherein the one or more electrical paths electrically couple one or more of the plurality of conductive pads in the first conductive layer to one or more of the solder pads in the second conductive layer, wherein the means for electrically interfacing is rigid, is adapted for solder reflow surface mounting, and has substantially planar top and bottom surfaces;

a micro-electro-mechanical system (MEMS) microphone die mounted to the top surface of the means for electrically interfacing and electrically coupled to at least one of the conductive pads in the first conductive layer; and a single-piece environmental protection means that includes an acoustic port, wherein the environmental protection means is formed from a solid material and has a predetermined shape with a rectangular top portion and a substantially vertical and continuous sidewall portion that adjoins the top portion at an angle and that completely surrounds and supports the top portion, the sidewall portion having a predetermined height, an exterior sidewall surface, an interior sidewall surface, and an attachment surface, the acoustic port disposed in the top portion of the environmental protection means and passing completely through the environmental protection means, wherein the attachment surface of the sidewall portion of the environmental protection means is aligned with and attached to a peripheral region along each edge of the top surface of the means for electrically interfacing, and wherein the predetermined height of the sidewall portion of the environmental protection means, the interior sidewall surface of the sidewall portion of the environmental protection means, and an interior surface of the top portion of the environmental protection means, in cooperation with the top surface of the means for electrically interfacing, provide a protective enclosure for the MEMS microphone die to reduce electromagnetic interference.

2. The silicon condenser microphone of claim 1, wherein the means for electrically interfacing further comprises a recess disposed within the means for electrically interfacing, and the MEMS microphone die is positioned over the recess.

3. The silicon condenser microphone of claim 1, wherein the means for electrically interfacing further comprises an internal cavity with an aperture in the top surface of the means for electrically interfacing, the internal cavity extending longitudinally within the means for electrically interfacing, and the MEMS microphone die is positioned over the aperture in the top surface of the means for electrically interfacing.

4. The silicon condenser microphone of claim 1, wherein the MEMS microphone die is a pressure-equalizing MEMS microphone die, and wherein a diaphragm of the MEMS microphone die defines a front volume and a back volume within the protective enclosure, and the acoustic port disposed in the environmental protection means is acoustically coupled to the diaphragm.

5. The silicon condenser microphone of claim 4, wherein the interface between the attachment surface of the sidewall portion of the environmental protection means and the top surface of the means for electrically interfacing is sealed to maintain acoustic pressure within the front volume.

6. The silicon condenser microphone of claim 1, wherein the first and second non-conductive layers comprise one or more layers of FR-4 printed circuit board material.

7. The silicon condenser microphone of claim 1, wherein the means for electrically interfacing further comprises:
a third conductive layer disposed on a lower surface of the first non-conductive layer;
a fourth conductive layer disposed on a upper surface of the second non-conductive layer, wherein the third and fourth conductive layers are patterned into electrodes;
a passive electronic material layer disposed between the third and fourth conductive layers and in electrical contact with the third and fourth conductive layers.

8. The silicon condenser microphone of claim 7, wherein the passive electronic material layer is a resistive material, and is electrically coupled to one or more of the plurality of conductive pads in the first conductive layer or one or more of the solder pads in the second conductive layer through one or more of the electrodes formed in the third and fourth conductive layers.

9. The silicon condenser microphone of claim 7, wherein the passive electronic material layer is a capacitive dielectric material, and is electrically coupled to one or more of the plurality of conductive pads in the first conductive layer or one or more of the solder pads in the second conductive layer through one or more of the electrodes formed in the third and fourth conductive layers.

10. The silicon condenser microphone of claim 7, wherein a passive electrical element formed in the passive electronic material layer filters one or more of an input signal, an output signal, or input power.

11. A micro-electro-mechanical system (MEMS) microphone, the microphone comprising:
means for electrically interfacing to a printed circuit board comprising:
a top layer comprising a first conductive layer with a first non-conductive layer disposed on a lower surface of the first conductive layer, wherein the first conductive layer is patterned to form a plurality of conductive pads;
a bottom layer comprising a second non-conductive layer with a second conductive layer disposed on a lower surface of the second non-conductive layer, wherein the second conductive layer is pattered to form a plurality of flat solder pads, the top and bottom layers in facing relation to each other;
one or more electrical paths disposed completely within the means for electrically interfacing, wherein the one or more electrical paths electrically couple one or more of the plurality of conductive pads in the first conductive layer to one or more of the solder pads in the second conductive layer; and
an acoustic port disposed in an interior region of the means for electrically interfacing and passing completely through the means for electrically interfacing, wherein one of the plurality of flat solder pads in the second conductive layer is a metal ring that completely surrounds the acoustic port in the means for electrically interfacing, wherein the means for electrically interfacing is rigid, is adapted for solder reflow surface mounting, and has substantially planar top and bottom surfaces;

a micro-electro-mechanical system (MEMS) microphone die mounted to the top surface of the means for electrically interfacing and electrically coupled to at least one of the conductive pads in the first conductive layer, the MEMS microphone die being disposed directly over the acoustic port in the means for electrically interfacing; and a single-piece environmental protection means, wherein the environmental protection means is formed from a solid material and has a predetermined shape with a rectangular top portion and a substantially vertical and continuous sidewall portion that adjoins the top portion at an angle and that completely surrounds and supports the top portion, the sidewall portion having a predetermined height, an exterior sidewall surface, an interior sidewall surface, and an attachment surface, wherein the attachment surface of the sidewall portion of the environmental protection means is aligned with and attached to a peripheral region along each edge of the top surface of the means for electrically interfacing, and wherein the predetermined height of the sidewall portion of the environmental protection means, the interior sidewall surface of the sidewall portion of the environmental protection means, and an interior surface of the top portion of the environmental protection means, in cooperation with the top surface of the means for electrically interfacing, provide a protective enclosure for the MEMS microphone die to reduce electromagnetic interference.

12. The MEMS microphone of claim 11, wherein the means for electrically interfacing further comprises an acoustic material that substantially blocks contaminants from passing through the acoustic port.

13. The MEMS microphone of claim 12, wherein the acoustic material to block environmental contaminants is a film of polymeric material.

14. The MEMS microphone of claim 12, wherein the acoustic material to block environmental contaminants is hydrophobic.

15. The MEMS microphone of claim 11, wherein the MEMS microphone die is a pressure-equalizing MEMS microphone die, wherein a diaphragm of the MEMS microphone die defines a front volume and a back volume within the protective enclosure, and the acoustic port disposed in the means for electrically interfacing of the substrate is acoustically coupled to the front volume.

16. The MEMS microphone of claim 15, wherein the interface between the attachment surface of the sidewall portion of the cover and the peripheral region of the top surface of the means for electrically interfacing is sealed to maintain acoustic pressure within the back volume.

17. The MEMS microphone of claim 11, wherein the means for electrically interfacing further comprises:

a third conductive layer disposed on a lower surface of the first non-conductive layer;

a fourth conductive layer disposed on a upper surface of the second non-conductive layer, wherein the third and fourth conductive layers are patterned into electrodes;

a passive electronic material layer disposed between the third and fourth conductive layers and in electrical contact with the third and fourth conductive layers.

18. The MEMS microphone of claim 17, wherein the passive electronic material layer is a resistive material, and is electrically coupled to one or more of the plurality of conductive pads in the first conductive layer or one or more of the solder pads in the second conductive layer through one or more of the electrodes formed in the third and fourth conductive layers.

19. The MEMS microphone of claim 17, wherein the passive electronic material layer is a capacitive dielectric material, and is electrically coupled to one or more of the plurality of conductive pads in the first conductive layer or one or more of the solder pads in the second conductive layer through one or more of the electrodes formed in the third and fourth conductive layers.

20. The MEMS microphone of claim 17, wherein a passive electrical element formed in the passive electronic material layer filters one or more of an input signal, an output signal, or input power.

* * * * *